(12) United States Patent
Sasaki et al.

(10) Patent No.: US 12,165,854 B2
(45) Date of Patent: Dec. 10, 2024

(54) SUBSTRATE SUPPORT AND SUBSTRATE PROCESSING APPARATUS

(71) Applicant: Tokyo Electron Limited, Tokyo (JP)

(72) Inventors: Nobutaka Sasaki, Miyagi (JP); Shin Matsuura, Miyagi (JP); Gyeong min Park, Miyagi (JP); Toshiki Akama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 361 days.

(21) Appl. No.: 17/504,523

(22) Filed: Oct. 19, 2021

(65) Prior Publication Data
US 2022/0122816 A1  Apr. 21, 2022

(30) Foreign Application Priority Data

Oct. 19, 2020 (JP) ................................ 2020-175632
Oct. 6, 2021 (JP) ................................ 2021-164879

(51) Int. Cl.
*H01J 37/32* (2006.01)
*H01L 21/683* (2006.01)

(52) U.S. Cl.
CPC .... *H01J 37/32715* (2013.01); *H01L 21/6833* (2013.01); *H01J 37/32091* (2013.01); *H01J 2237/2007* (2013.01); *H01J 2237/20235* (2013.01); *H01J 2237/334* (2013.01)

(58) Field of Classification Search
CPC .... H01J 2237/2007; H01J 2237/20235; H01L 21/68735; H01L 21/68721; H01L 21/68742
See application file for complete search history.

(56) References Cited

U.S. PATENT DOCUMENTS 6,148,762 A * 11/2000 Fukuda ............. H01L 21/68742
414/935

FOREIGN PATENT DOCUMENTS

| CN | 101093815 A | * 12/2007 | ....... H01L 21/68742 |
|---|---|---|---|
| JP | 2016-146472 A | 8/2016 | |
| KR | 20090031038 A | * 3/2009 | |
| KR | 101256485 B1 | * 4/2013 | |
| WO | 2018/222430 A2 | 12/2018 | |

* cited by examiner

*Primary Examiner* — Tyrone V Hall, Jr.
(74) *Attorney, Agent, or Firm* — XSENSUS LLP

(57) ABSTRACT

A substrate support includes a base, a support portion, a first pin member, a second pin member and a driving unit. The base has a first surface on which an object to be supported is placed, a second surface opposite to the first surface, and a first through-hole. The support portion has a third surface in contact with the second surface, a fourth surface opposite to the third surface, and a second through-hole. The first pin member is stored in the first through-hole and a second pin member is stored in the second through-hole. The first through-hole is larger on the second surface side than on the first surface side, and/or the second through-hole is larger on the third surface side than on the fourth surface side.

19 Claims, 28 Drawing Sheets

SUBSTRATE SUPPORT AND SUBSTRATE PROCESSING APPARATUS

CROSS-REFERENCE TO RELATED APPLICATIONS

This application claims priority to Japanese Patent Application Nos. 2020-175632 filed on Oct. 19, 2020 and 2021-164879 filed on Oct. 6, 2021, respectively, the entire contents of which are incorporated herein by reference.

TECHNICAL FIELD

The present disclosure relates to a substrate support and a substrate processing apparatus.

BACKGROUND

Japanese Patent Application Publication No. 2016-146472 discloses an edge ring that is disposed at a radially outer edge of a substrate support and can be moved to a raised position by an actuator and removed from a processing chamber by a robot arm.

SUMMARY

The present disclosure provides a technique capable of reducing a gap between a though-hole and a pin while allowing the pin to be movable even if the through-hole is displaced.

One aspect of the present disclosure provides a substrate support including a base, a support portion, a first pin member, a second pin member and a driving unit. The base has a first surface on which an object to be supported is placed and a second surface opposite to the first surface. The base has a first through-hole penetrating through the first surface and the second surface. The support portion is disposed to overlap the second surface side of the base and the support portion has a third surface in contact with the second surface and a fourth surface opposite to the third surface. The support portion has a second through-hole penetrating through the third surface and the fourth surface and communicating with the first through-hole. The first pin member is stored in the first through-hole to be movable in an axial direction of the first through-hole. The second pin member is stored in the second through-hole to be movable in the axial direction and has an end portion at the third surface side, the end portion being slidably in contact with the first pin member. The driving unit configured to drive the second pin member in the axial direction. Further, the first through-hole is larger on the second surface side than on the first surface side, and/or the second through-hole is larger on the third surface side than on the fourth surface side.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a substrate support and a substrate processing apparatus of the present disclosure will be described in detail with reference to the accompanying drawings. The following embodiments are not intended to limit the substrate support and the substrate processing apparatus of the present disclosure.

There is known a substrate processing apparatus in which a substrate is placed on a substrate support disposed in a processing chamber, and substrate processing such as plasma processing, e.g., as etching or the like, is performed on the substrate while setting the processing chamber to a vacuum state. In such a substrate processing apparatus, a through-hole is formed in the substrate support to store a lifter pin, and the lifter pin is lifted so that the substrate or a ring member disposed around the substrate is raised from the substrate support and loaded and unloaded.

The substrate support may be formed by stacking a plurality of members. In this case, due to a difference in a temperature or a coefficient of thermal expansion between the members, the members may be displaced and, thus, the through-holes may be displaced. When the through-hole is displaced, the lifter pin stored in the through-hole may be damaged. Therefore, a large through-hole is formed in the substrate support to increase a gap between the through-hole and the lifter pin. However, when a large gap is ensured between the through-hole and the lifter pin in the substrate support, a problem may occur. For example, when the plasma process is performed, abnormal discharge may occur in the gap.

Therefore, there is expected a technique capable of reducing the gap between the pin and the through-hole while allowing the pin to be movable even if the through-hole is displaced.

Embodiment (Configuration of Substrate Processing Apparatus)

Figure 1:
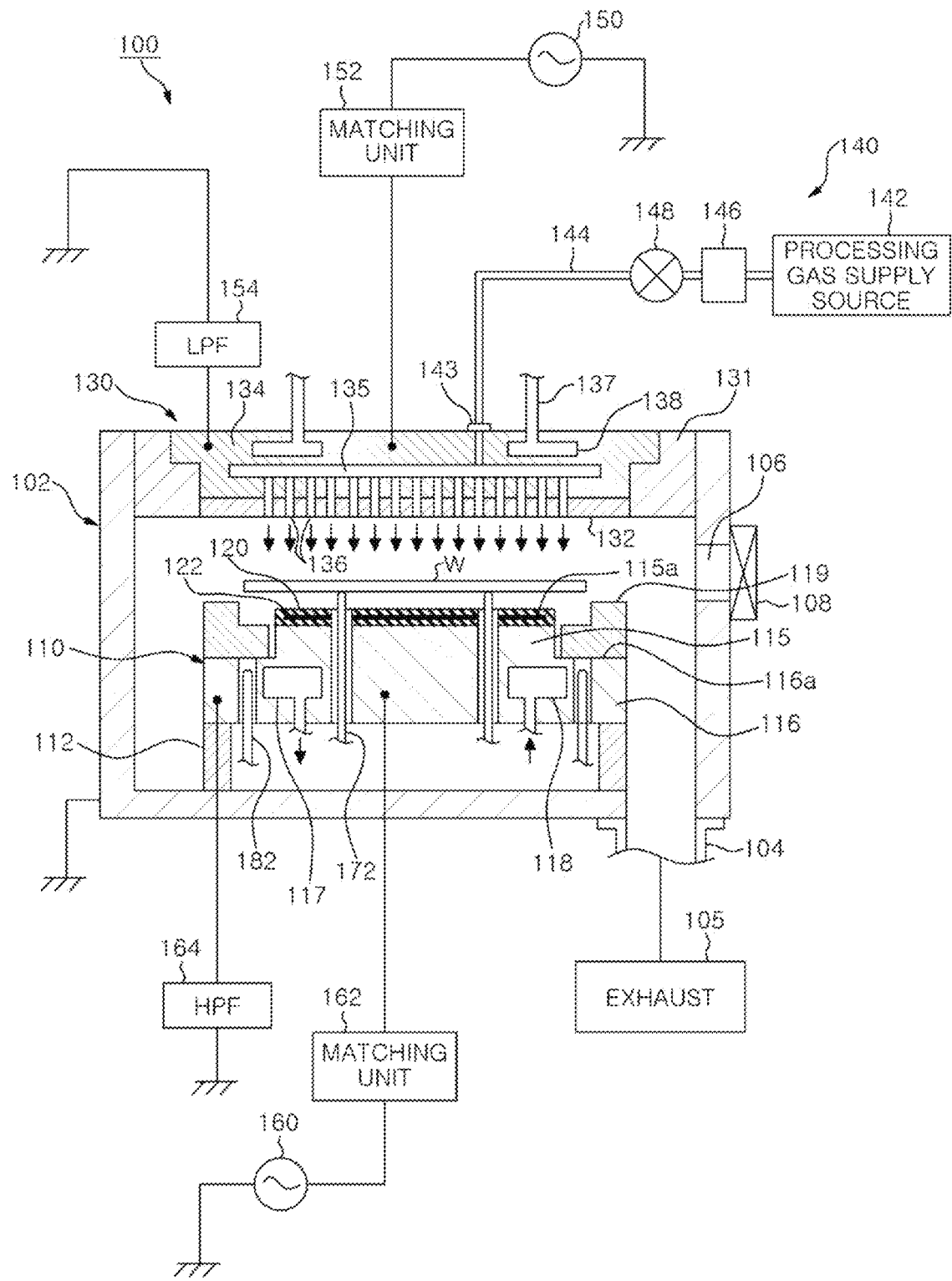
FIG. 1 shows an example of a configuration of a substrate processing apparatus according to an embodiment.

An embodiment will be described. Hereinafter, a case where a substrate processing apparatus of the present disclosure is a plasma processing apparatus for performing plasma processing will be described as an example. FIG. 1 shows an example of a configuration of a substrate processing apparatus 100 according to an embodiment. The substrate processing apparatus 100 shown in FIG. 1 is, e.g., a capacitively coupled plasma (CCP) etching apparatus including parallel plate type electrodes.

The substrate processing apparatus 100 includes a cylindrical processing chamber 102 made of aluminum having an anodically oxidized (alumite-treated) surface. The processing chamber 102 is grounded. A substantially cylindrical substrate support 110 for placing a substrate W such as a semiconductor wafer or the like is disposed at an inner bottom portion of the processing chamber 102. The substrate support 110 is supported by an annular insulator 112 made of ceramic or the like.

The substrate support 110 includes a temperature adjusting mechanism 117 capable adjusting a temperature of the substrate support 110 to a predetermined temperature. The temperature adjusting mechanism 117 is configured to circulate temperature control fluid such as a coolant or a heat transfer gas in a flow path 118 disposed in the substrate support 110, for example.

The substrate support 110 has on an upper central portion thereof a convex substrate supporting portion 115 for placing the substrate W. Further, the substrate support 110 has on an outer peripheral side of the substrate supporting portion 115 an outer peripheral portion 116 whose upper surface is lower than the substrate supporting portion 115. The upper surface of the substrate supporting portion 115 serves as a first placement surface 115a on which the substrate W is placed. The upper surface of the outer peripheral portion 116 serves as a second placement surface 116a on which an edge ring 119 such as a focus ring or a cover ring is placed. When an electrostatic chuck 120 is disposed on the substrate supporting portion 115, the upper surface of the electrostatic chuck 120 serves as the first placement surface 115a. Hereinafter, the substrate supporting portion 115 and the electrostatic chuck 120 are collectively referred to as "substrate supporting portion 115." The electrostatic chuck 120 has a structure in which an electrode 122 is embedded between insulating materials. A DC voltage of, e.g., 1.5 kV is applied from a DC power supply (not shown) connected to the electrode 122 to the electrostatic chuck 120. Accordingly, the substrate W is electrostatically attracted to the electrostatic chuck 120. The substrate supporting portion 115 has a diameter smaller than a diameter of the substrate W. When the substrate W is placed on the substrate supporting portion 115, a peripheral portion of the substrate W protrudes from the substrate supporting portion 115.

The edge ring 119 is disposed at an upper peripheral portion of the substrate support 110 to surround the substrate W placed on the first placement surface 115a of the electrostatic chuck 120. The edge ring 119 is placed on the second placement surface 116a of the outer peripheral portion 116 such that an inner peripheral surface of the edge ring 119 surrounds an outer peripheral surface of the substrate supporting portion 115.

A gas passage for supplying a heat transfer medium (e.g., a backside gas such as He gas) to the backside of the substrate W placed on the first placement surface 115a is formed in the insulator 112, the substrate support 110, and the electrostatic chuck 120. The substrate W is maintained at a predetermined temperature by heat transfer between the substrate support 110 and the substrate W using the heat transfer medium.

The substrate support 110 is provided with first lifter pins 172 that can be moved up and down from the first placement surface 115a. Further, the substrate support 110 is provided with second lifter pins 182 that can be moved up and down from the second placement surface 116a. The first lifter pins 172 are driven by a driving unit (not shown), and can lift up the substrate W from the first placement surface 115a. The second lifter pins 182 are driven by a driving unit (not shown), and can lift up the edge ring 119 from the second placement surface 116a.

An upper electrode 130 is disposed above the substrate support 110 to face the substrate support 110. The space formed between the upper electrode 130 and the substrate support 110 serves as a plasma generation space. The upper electrode 130 is supported at an upper portion of the processing chamber 102 via an insulating shielding member 131.

The upper electrode 130 mainly includes an electrode plate 132 and an electrode holder 134. The electrode holder 134 detachably holds the electrode plate 132. The electrode plate 132 is made of, e.g., quartz. The electrode holder 134 is made of, e.g., a conductive material such as aluminum having an alumite-treated surface.

The electrode holder 134 is provided with a processing gas supplier 140 for introducing a processing gas from a processing gas supply source 142 into the processing chamber 102. The processing gas supply source 142 is connected to a gas inlet port 143 of the electrode holder 134 through a gas supply line 144.

A mass flow controller (MFC) 146 and an on-off valve 148 are disposed in the gas supply line 144 in that order from an upstream side. Further, a flow control system (FCS) may be disposed instead of the MFC.

The processing gas supply source 142 supplies various gases used for substrate processing. For example, the processing gas supply source 142 supplies an etching gas for plasma etching. Although FIG. 1 shows only one processing gas supply system including the gas supply line 144, the on-off valve 148, the mass flow controller 146, the processing gas supply source 142, or the like, the substrate processing apparatus 100 may include multiple processing gas supply systems.

A substantially cylindrical gas diffusion space 135 is formed in the electrode holder 134. The processing gas introduced from the gas supply line 144 flows from the gas inlet port 143 to the gas diffusion space 135. The gas diffusion space 135 uniformly diffuses the processing gas. A plurality of gas injection holes 136 communicating with the inside of the processing chamber 102 is formed in the bottom portion of the electrode holder 134 and the electrode plate 132. The processing gas diffused in the gas diffusion space 135 is uniformly injected from the gas injection holes 136 toward the plasma generation space. In this manner, the upper electrode 130 functions as a shower head for supplying the processing gas.

The upper electrode 130 includes an electrode holder temperature controller 137 capable of adjusting the electrode holder 134 to a predetermined temperature. The electrode holder temperature controller 137 is configured to circulate temperature control fluid in a flow path 138 formed in the electrode holder 134, for example.

An exhaust line 104 is connected to the bottom portion of the processing chamber 102. An exhaust 105 is connected to the exhaust line 104. The exhaust 105 includes a vacuum pump such as a turbo molecular pump or the like. The exhaust 105 adjusts a pressure in the processing chamber 102 to a predetermined depressurized atmosphere. The processing chamber 102 is evacuated by adjusting the pressure in the processing chamber 102 to a predetermined depressurized atmosphere using the exhaust 105.

A loading/unloading port 106 is disposed on a sidewall of the processing chamber 102. The substrate W or the edge ring 119 is loaded into and unloaded from the processing chamber 102 through the loading/unloading port 106. A gate valve 108 is disposed at the loading/unloading port 106. For example, in the case of loading the substrate W, the gate valve 108 is opened. Then, the substrate W is loaded through the loading/unloading port 106 by a transfer arm (not shown) and transferred to and from the first lifter pins 172 lifted from the substrate support 110. Similarly, in the case of loading the edge ring 119, the gate valve 108 is opened. Then, the edge ring 119 is loaded through the loading/unloading port 106 by a transfer arm (not shown) and transferred to and from the second lifter pins 182 lifted from the substrate support 110. The substrate W or the edge ring 119 is unloaded in the reverse order of the loading process.

A first radio frequency (RF) power supply 150 is connected to the upper electrode 130 through a power supply line, and a first matching unit 152 is disposed in the power supply line. The first RF power supply 150 can output an RF power for plasma generation having a frequency within a range of 50 MHz to 150 MHz. By applying the power having such a high frequency to the upper electrode 130, it is possible to form high-density plasma in a preferable dissociated state in the processing chamber 102. Accordingly, the plasma processing can be performed under a lower pressure condition. The frequency of the output power of the first RF power supply 150 is preferably 50 MHz to 80 MHz, and is typically adjusted to a frequency of 60 MHz or close thereto.

The substrate support 110 is made of a conductive material and functions as a lower electrode. A second RF power supply 160 is connected to the substrate support 110 through a power supply line, and a second matching unit 162 is disposed in the power supply line. The second RF power supply 160 can output an RF power for bias having a frequency within a range of several hundreds kHz to several tens MHz. The frequency of the output power of the second RF power supply 160 is typically adjusted to 2 MHz, 13.56 MHz, or the like.

A high-pass filter (HPF) 164 for filtering an RF current flowing from the first RF power supply 150 is connected to the substrate support 110. A low-pass filter (LPF) 154 for filtering an RF current flowing from the second RF power supply 160 to the upper electrode 130 is connected to the upper electrode 130.

Example of Lifter Pin and Driving Unit

Figure 2:
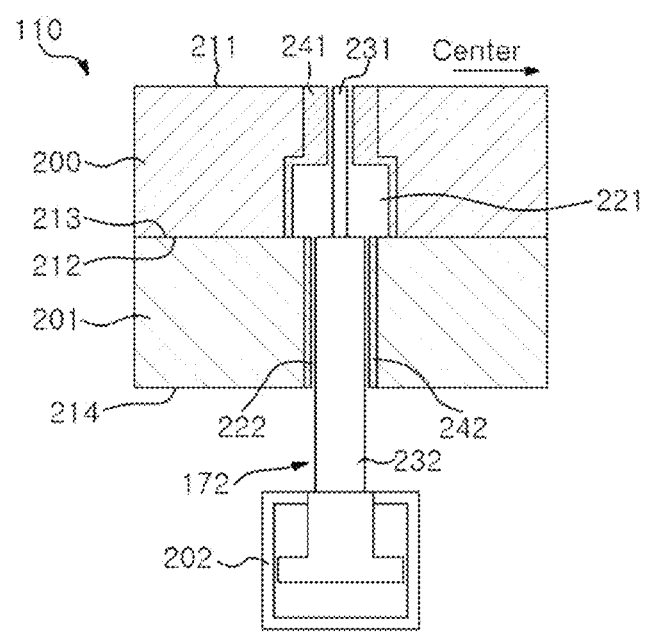
FIG. 2 is a simplified view showing an example of a configuration of a substrate support according to an embodiment.

As described above, in the substrate support 110, the first lifter pins 172 can be moved up and down from the first placement surface 115a, and the second lifter pins 182 can be moved up and down from the second placement surface 116a. The configuration for raising and lowering the first lifter pins 172 is substantially the same as that for raising and lowering the second lifter pins 182. Hereinafter, the configuration for raising and lowering the first lifter pins 172 will be described. FIG. 2 is a simplified view showing an example of the configuration of the substrate support 110 according to the embodiment. FIG. 2 shows the configuration for raising and lowering the first lifter pins 172.

The substrate support 110 includes a base 200, a support portion 201, the first lifter pins 172, and a driving unit 202. The base 200 and the support portion 201 are laminated.

The base 200 has a first surface 211 on which an object to be supported is placed and a second surface 212 that is the back surface of the first surface 211. The first surface 211 serves as the first placement surface 115a on which the substrate W is placed in the substrate supporting portion 115, and serves as the second placement surface 116a on which the edge ring 119 is placed in the outer peripheral portion 116. Further, when the electrostatic chuck 120 is disposed at the substrate supporting portion 115, the electrostatic chuck 120 is disposed on the first surface 211.

The base 200 has a plurality of first through-holes 221 penetrating through the first surface 211 and the second surface 212 to correspond to the arrangement positions of the first lifter pins 172. In FIG. 2, the first through-hole 221 is formed in a vertical direction.

The support portion 201 is disposed to overlap the second surface 212 side of the base 200. The support portion 201 has a third surface 213 to be in contact with the second surface 212 and a fourth surface 214 that is the back surface of the third surface 213.

The support portion 201 has a second through-hole 222 penetrating through the third surface 213 and the fourth surface 214 to correspond to the position of the first through-hole 221 and communicating with the first through-hole 221. In FIG. 2, the second through-hole 222 is formed in the vertical direction, similarly to the first through-hole 221. The second through-hole 222 is formed at the same position as that of the first through-hole 221 in the same direction as that of the first through-hole 221.

When the substrate support 110 includes the temperature adjusting mechanism 117, the temperature adjusting mechanism 117 is disposed at any one of the base 200 and the support portion 201. For example, the above-described flow path 118 is formed in the base 200. The base 200 is adjusted to a predetermined temperature by circulating temperature control fluid in the flow path 118.

The first lifter pin 172 is divided into a first pin member 231 and a second pin member 232. Each of the first pin member 231 and the second pin member 232 is formed in a rod shape having a predetermined radius.

The first pin member 231 is stored in the first through-hole 221 and is movable in an axial direction of the first through-hole 221. In FIG. 2, the first pin member 231 is movable in the vertical direction. In the base 200, a sleeve 241 is disposed along a surface of the first through-hole 221 to adjust friction on a contact surface with the first pin member 231, electrical characteristics, or the like. The sleeve 241 is not necessarily provided and may be omitted.

The second pin member 232 is stored in the second through-hole 222 and is movable in the axial direction. In FIG. 2, the second pin member 232 is also movable in the vertical direction. An end portion of the second pin member 232 on the third surface 213 side is slidably in contact with the first pin member 231. In the support portion 201, a sleeve 242 is disposed along a surface of the second through-hole 222 to adjust friction on a contact surface with the second pin member 232, electrical characteristics, or the like. The sleeve 242 is not necessarily provided and may be omitted.

The driving unit 202 drives the second pin member 232 in the axial direction. For example, the driving unit 202 is a motor such as a DC motor, a stepping motor, or a linear motor, a piezo actuator, an air driving mechanism, or the like. The driving unit 202 drives the second pin member 232 in the vertical direction with a driving accuracy suitable for the transfer of the substrate W and the transfer of the edge ring 119. For example, in the case of lifting up the substrate W, the driving unit 202 moves the second pin member 232 upward. By moving the second pin member 232 upward, the first pin member 231 is pressed by the second pin member 232 and moved upward. Accordingly, the first pin member 231 protrudes from the first surface 211, and the substrate W is lifted up.

In at least one of the first through-hole 221 and the second through-hole 222), the first through-hole 221 is larger on the second surface 212 side than on the first surface 211 side, and the second through-hole 222 is larger on the third surface 213 side than on the fourth surface 214 side. In other words, in at least one of the base 200 and the support portion 201, the diameter of the first through-hole 221 is larger on the second surface 212 side than on the first surface 211 side, and the diameter of the second through-hole 222 is larger on the third surface 213 side than on the fourth surface 214 side. For example, in the example of FIG. 2, the first through-hole 221 is larger on the second surface 212 side than on the first surface 211 side.

Figure 3A:
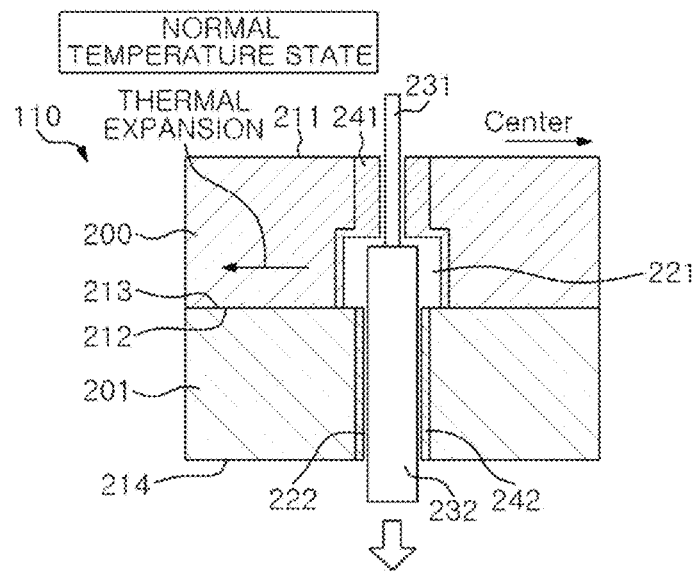
FIGS. 3A to 3C show an example of occurrence of displacement in the substrate support according to the embodiment.
Figure 3B:
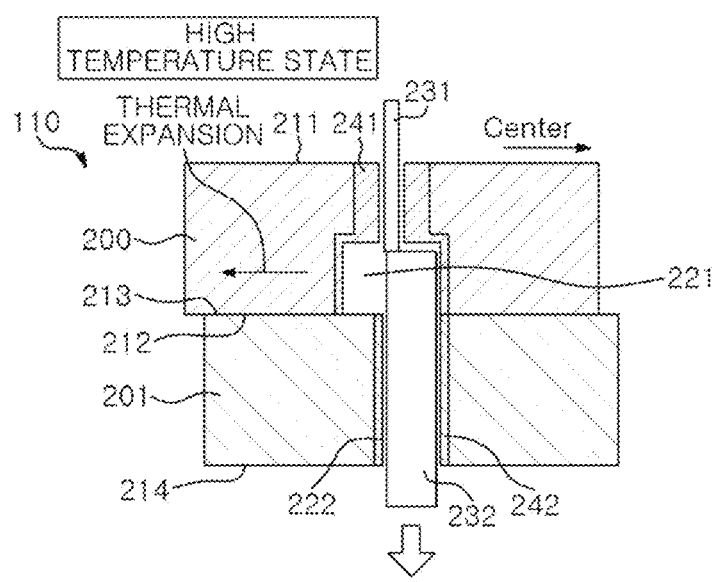
Figure 3C:
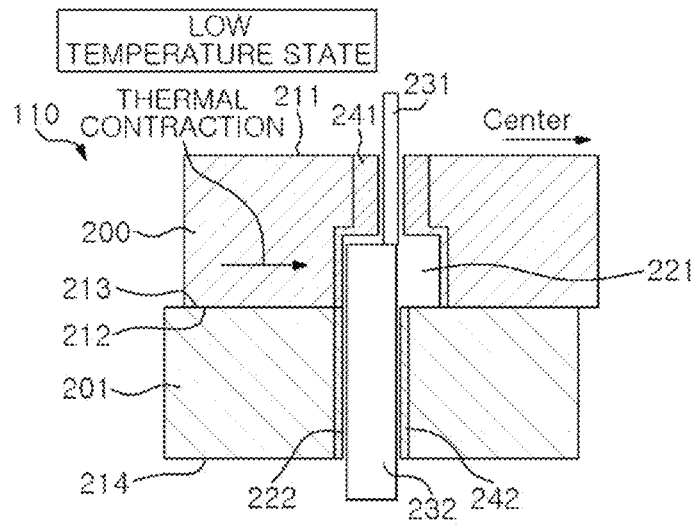

When the substrate support 110 is formed by laminating the base 200 and the support portion 201, the base 200 and the support portion 201 may be displaced due to the difference in the temperature or the coefficient of thermal expansion between the base 200 and the support portion 201 and, thus, the first through-hole 221 and the second through-hole 222 may be displaced. FIGS. 3A to 3C show an example of occurrence of displacement in the substrate support 110 according to the embodiment. FIGS. 3A to 3C show a case where displacement occurs in the substrate support 110 shown in FIG. 2. FIG. 3A shows a case where the axes of the first through-hole 221 and the second through-hole 222 are aligned in a predetermined normal temperature state. FIG. 3B shows a case where the first through-hole 221 is displaced to the left side with respect to the second through-hole 222 when the temperature becomes higher than the normal temperature and the thermal expansion of the base 200 is greater than that of the support portion 201. FIG. 3C shows a case where the first through-hole 221 is displaced to the right side with respect to the second through-hole 222 when the temperature becomes lower than the normal temperature and the thermal contraction of the base 200 is greater than that of the support portion 201.

Figure 4A:
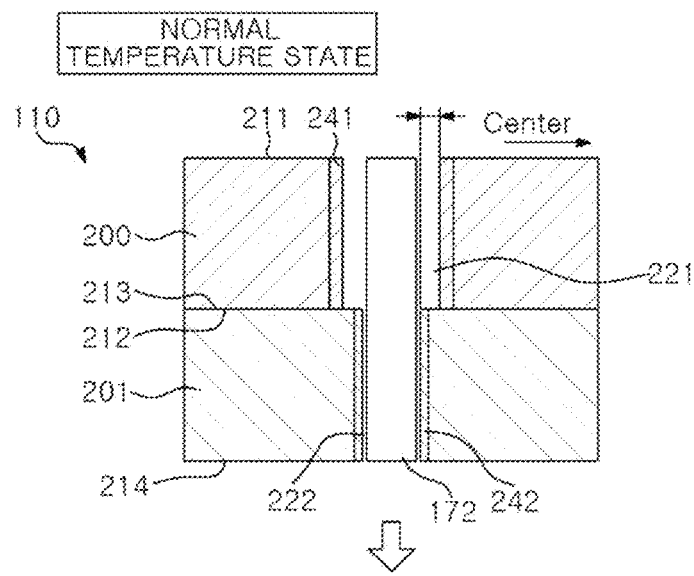
FIGS. 4A to 4C show an example of occurrence of displacement in a substrate support using a conventional lifter pin.
Figure 4B:
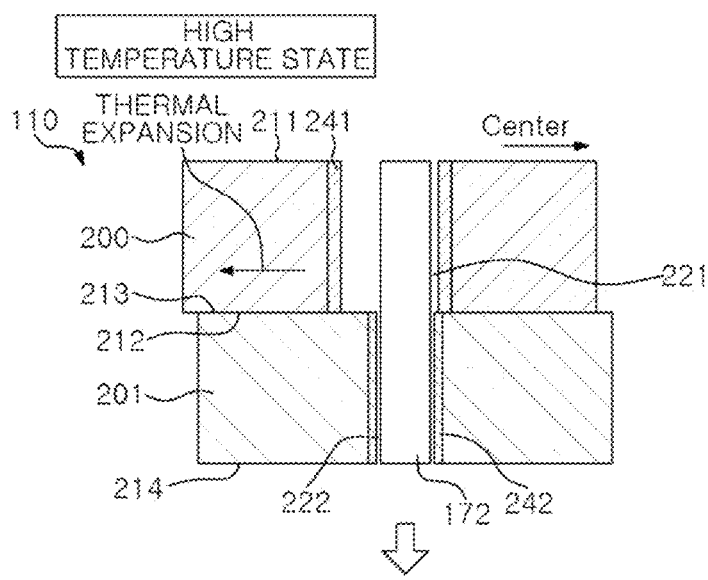
Figure 4C:
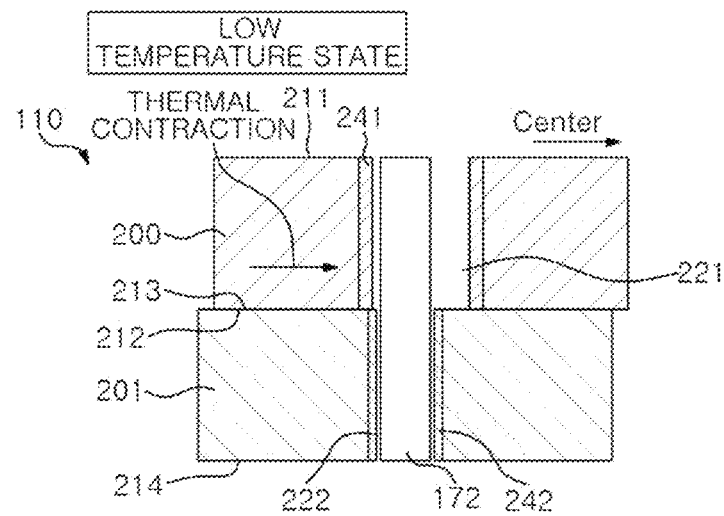

Conventionally, the lifter pin is formed as one member without being divided. In that case, if the through-hole is displaced, the lifter pin stored in the through-hole may be damaged. FIGS. 4A to 4C show an example of occurrence of displacement in the substrate support 110 using the lifter pin having the conventional structure. FIGS. 4A to 4C show a case where the first lifter pin 172 is formed as one member without being divided. FIG. 4A shows a case where the axes of the first through-hole 221 and the second through-hole 222 are aligned in a predetermined normal temperature state. FIG. 4B shows a case where the first through-hole 221 is displaced to the left side with respect to the second through-hole 222 when the temperature becomes higher than the normal temperature and the thermal expansion of the base 200 is greater than that of the support portion 201. FIG. 4C shows a case where the first through-hole 221 is displaced to the right side with respect to the second through-hole 222 when the temperature becomes lower than the normal temperature and the thermal contraction of the base 200 is greater than that of the support portion 201. For example, in FIGS. 4A to 4C, when the first through-hole 221 has the same diameter as that of the second through-hole 222, if the first through-hole 221 and the second through-hole 222 are displaced as shown in FIGS. 4B and 4C, the first lifter pin 172 is damaged. Therefore, the first through-hole 221 has a diameter greater than that of the second through-hole 222. However, a large diameter of the first through-hole 221 may cause a problem. For example, when the plasma processing is performed, abnormal discharge may occur in the gap between the first through-hole 221 and the first lifter pin 172.

Therefore, in the present embodiment, as shown in FIGS. 2 and 3, the first through-hole 221 is larger on the second surface 212 side than on the first surface 211 side. For example, the radius of the first through-hole 221 with respect to the direction of the displacement caused by the difference in the thermal expansion between the base 200 and the support portion 201 is larger on the second surface 212 side than on the first surface 211 side by a displacement width or more. The second pin member 232 is moved toward the third surface 213 side by the driving unit 202 and enters the first through-hole 221. The first through-hole 221 is larger on the second surface 212 side than on the first surface 211 side at least in a range where the second pin member 232 enters from the second surface 212.

For example, the positional displacement between the first through-hole 221 and the second through-hole 222 can be expressed by the following Eq. (1).

$$\Delta R = |R(E_2 \cdot \Delta T_2 - E_1 \cdot \Delta T_1)| \qquad \text{Eq. (1)}$$

Here, $\Delta R$ indicates the positional displacement between the first through-hole 221 and the second through-hole 222.

R indicates a distance between the center of the substrate support 110 and the central positions of the first through-hole 221 and the second through-hole 222 in a state where the axes of the first through-hole 221 and the second through-hole 222 are aligned (e.g., the normal temperature state of FIG. 3A).

$E_1$ indicates a coefficient of linear expansion of the support portion 201.

$\Delta T_1$ indicates a change in the temperature of the support portion 201 from the temperature in the normal temperature state.

$E_2$ indicates a coefficient of linear expansion of the base 200.

$\Delta T_2$ indicates a change in the temperature of the base 200 from the temperature in the normal temperature state.

The radius of the first through-hole 221 is larger on the second surface 212 side than on the first surface 211 side by the positional displacement $\Delta R$ at least in the range where the second pin member 232 enters from the second surface 212.

For example, a gap $\Delta C_2$ between the sleeve 241 and the first pin member 231 on the second surface 212 side of the first through-hole 221 can be obtained from the following Eqs. (2-1) to (2-3).

$$\Delta C_2 = |S'_2 - d'_1| - \Delta R \qquad \text{Eq. (2-1)}$$

$$S'_2 = S_2 + S_2 \cdot E_2 \cdot \Delta T_2 \qquad \text{Eq. (2-2)}$$

$$d'_1 = d_1 + d_1 \cdot E_1 \cdot \Delta T_1 \qquad \text{Eq. (2-3)}$$

Here, $\Delta C_2$ indicates the gap between the sleeve 241 and the second pin member 232.

$S'_2$ indicates a change in the diameter of the sleeve 241 depending on temperatures.

$d'_1$ indicates a change in the diameter of the second pin member 232 depending on temperatures.

$S_2$ indicates a diameter of the sleeve 241 in a state where the first through-hole 221 and the second through-hole 222 are aligned (the normal temperature state in FIG. 3A).

$d_1$ indicates a diameter of the second pin member 232 in the normal temperature state.

The first through-hole 221 is designed such that the gap $\Delta C_2$ between the sleeve 241 and the second pin member 232 satisfies a condition $\Delta C_2 > 0$ in the region where at least the second pin member 232 enters from the second surface 212.

Thus, even if the positions of first through-hole 221 and the second through-hole 222 are displaced, the movement range of the displaced second pin member 232 that has entered the first through-hole 221 is within the first through-hole 221. Accordingly, the damage to the second pin member 232 can be suppressed.

Since the end portions of the first pin member 231 and the second pin member 232 are in contact with each other even if the positions of the first pin member 231 and the second pin member 232 are displaced, the sum of the radii thereof with respect to the displacement direction is greater than the displacement width. For example, in FIGS. 2 and 3, the first pin member 231 is exposed to plasma on the first surface 211 side, so that the first pin member 231 is formed as thin as possible within an allowable design range. The second pin member 232 has a radius greater than or equal to a value obtained by adding the displacement width to the radius of the first pin member 231 so that the first pin member 231 can be supported even if the first through-hole 221 and the second through-hole 222 are displaced.

The first pin member 231 and the second pin member 232 are slidably in contact with each other. Therefore, even if the positions of the first through-hole 221 and the second through-hole 222 are displaced, the second pin member 232 is moved with the second through-hole 222 to be in contact with the first pin member 231. Accordingly, when the second pin member 232 is raised by the driving unit 202, the second pin member 232 can press the first pin member 231 upward. The first pin member 231 is pressed by the second pin member 232 and moved upward. Hence, the first pin member 231 protrudes from the first surface 211, and the substrate W is lifted up.

Further, the first pin member 231 is moved with the first through-hole 221 even if the positions of the first through-hole 221 and the second through-hole 222 are displaced. Accordingly, the gap between the first through-hole 221 and the first pin member 231 on the first surface 211 side can be set to an appropriate value without considering the positional displacement. For example, the gap between the first through-hole 221 and the first pin member 231 on the first surface 211 side can be set to a gap at which abnormal discharge is suppressed or a gap at which the first pin member 231 is slidable in the vertical direction. Hence, the occurrence of abnormal discharge can be suppressed.

In the above embodiment, as shown in FIGS. 2 and 3, the case where the first through-hole 221 is larger on the second surface 212 side than on the first surface 211 side has been described as an example. However, the present disclosure is not limited thereto. FIGS. 5A to 23B show other examples of the substrate support 110 and the edge ring 119.

Figure 5A:
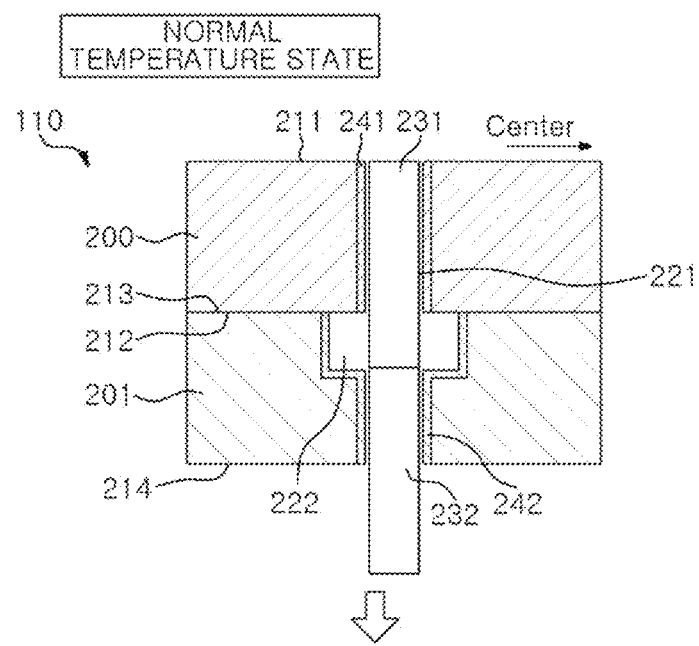
FIGS. 5A and 5B are simplified views showing another example of the configuration of the substrate support according to the embodiment.
Figure 5B:
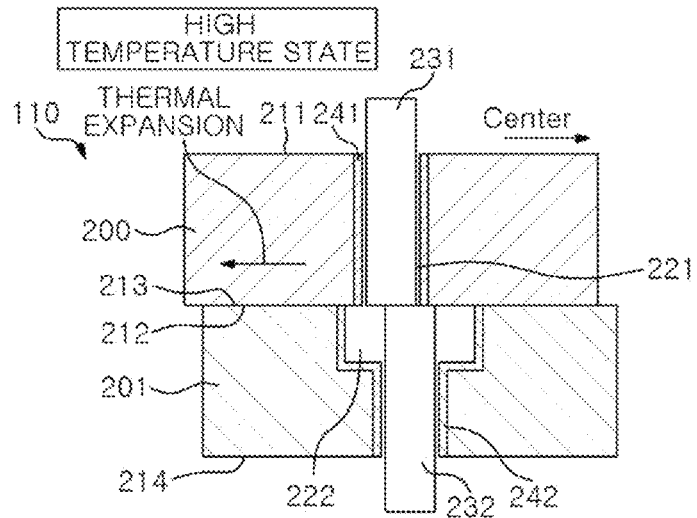

In the substrate support 110, the second through-hole 222 may be larger on the third surface 213 side than on the fourth surface 214 side. FIGS. 5A and 5B are simplified views showing another example of the configuration of the substrate support 110 according to the embodiment. FIGS. 5A and 5B show a configuration in which the first lifter pin 172 is moved up and down. FIG. 5A shows a case where the axes of the first through-hole 221 and the second through-hole 222 are aligned in a predetermined normal temperature state. FIG. 5B shows a case where the first through-hole 221 is displaced to the left side with respect to the second through-hole 222 when the temperature becomes higher than the normal temperature and the thermal expansion of the base 200 is greater than that of the support portion 201. In FIGS.

5A and 5B, the first pin member 231 and the second pin member 232 have the same thickness.

The second through-hole 222 is larger on the third surface 213 side than on the fourth surface 214 side. In other words, in the support portion 201, the diameter of the second through-hole 222 is larger on the third surface 213 side than on the fourth surface 214 side.

The first pin member 231 has entered the second through-hole 222. In the case of lifting up the substrate W, the second pin member 232 is moved upward in the second through-hole 222 by the driving unit 202. By moving the second pin member 232 upward, the first pin member 231 is pressed by the second pin member 232 and moved upward. Accordingly, the first pin member 231 protrudes from the first surface 211, and the substrate W is lifted up.

The second through-hole 222 is larger on the third surface 213 side than on the fourth surface 214 side at least in the region where the first pin member 231 enters from the third surface 213.

For example, a gap $\Delta C_1$ between the sleeve 242 and the first pin member 231 on the third surface 213 side of the second through-hole 222 can be obtained from the following Eqs. (3-1) to (3-3).

$$\Delta C_1 = |S'_1 - d'_2| - \Delta R \quad \text{Eq. (3-1)}$$

$$S'_1 = S_1 + S_1 \cdot E_1 \cdot \Delta T_1 \quad \text{Eq. (3-2)}$$

$$d'_2 = d_2 + d_2 \cdot E_2 \cdot \Delta T_2 \quad \text{Eq. (3-3)}$$

Here, $\Delta C_1$ indicates the gap between the sleeve 242 and the first pin member 231.

$S'_1$ indicates a change in a diameter of the sleeve 242 depending on temperatures.

$d'_2$ indicates a change in a diameter of the first pin member 231 depending on temperatures.

$S_1$ indicates a diameter of the sleeve 242 in a state where the first through-hole 221 and the second through-hole 222 are aligned (e.g., the normal temperature state of FIG. 5A).

$d_2$ indicates a diameter of the first pin member 231 in the normal temperature state.

The second through-hole 222 is designed such that the gap $\Delta C_1$ between the sleeve 242 and the first pin member 231 satisfies a condition $\Delta C1 > 0$ at least in the region where the first pin member 231 enters from the third surface 213.

Accordingly, even if the positions of the first through-hole 221 and the second through-hole 222 are displaced, the movement range of the displaced first pin member 231 that has entered the second through-hole 222 is within the second through-hole 222. Hence, the damage to the first pin member 231 caused by the displacement can be suppressed.

Figure 6A:
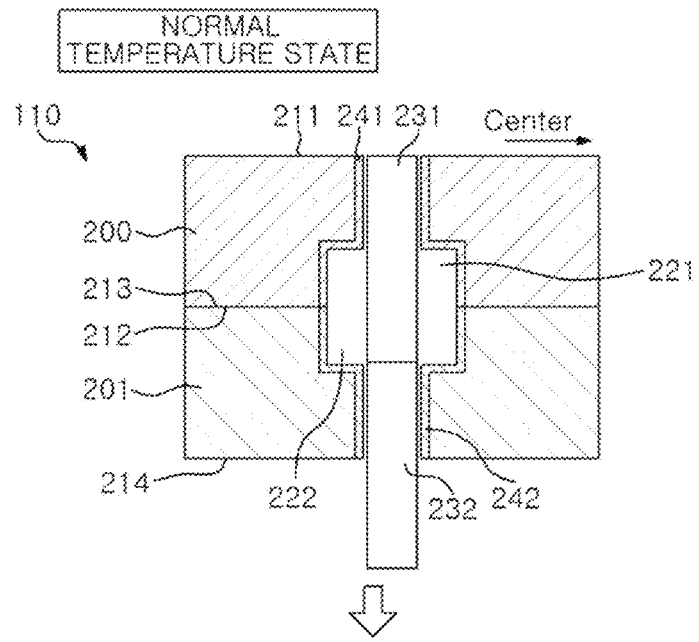
FIGS. 6A and 6B are simplified views showing still another example of the configuration of the substrate support according to the embodiment.
Figure 6B:
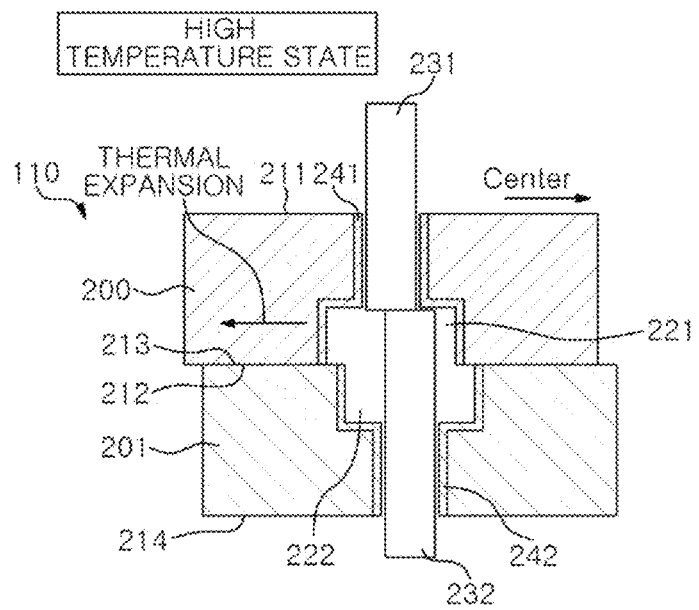

In the substrate support 110, the first through-hole 221 may be larger on the second surface 212 side of than on the first surface 211 side, and the second through-hole 222 may be larger on the third surface 213 side of than on the fourth surface 214 side. FIGS. 6A and 6B are simplified views showing another example of the configuration of the substrate support 110 according to the embodiment. FIGS. 6A and 6B show the configuration in which the first lifter pin 172 is moved up and down. FIG. 6A shows a case where the axes of the first through-hole 221 and the second through-hole 222 are aligned in a predetermined normal temperature state. FIG. 6B shows a case where the first through-hole 221 is displaced to the left side with respect to the second through-hole 222 when the temperature becomes higher than the normal temperature state and the thermal expansion of the base 200 is greater than that of the support portion 201.

In FIGS. 6A and 6B, the first pin member 231 and the second pin member 232 have the same thickness.

The first through-hole 221 is larger on the second surface 212 side than on the first surface 211 side. The second through-hole 222 is larger on the third surface 213 side than on the fourth surface 214 side. In other words, in the base 200, the diameter of the first through-hole 221 is larger on the second surface 212 side than on the first surface 211 side. In the support portion 201, the diameter of the second through-hole 222 is larger on the third surface 213 side than on the fourth surface 214 side.

The first pin member 231 has entered the second through-hole 222. The second through-hole 222 is larger on the third surface 213 side than on the fourth surface 214 side at least in the region where the first pin member 231 enters from the third surface 213.

Accordingly, even if the positions of the first through-hole 221 and the second through-hole 222 are displaced, the movement range of the displaced first pin member 231 that has entered the second through-hole 222 is within the second through-hole 222. Therefore, the damage to the first pin member 231 caused by the displacement can be suppressed.

In the case of lifting up the substrate W, the second pin member 232 is moved upward into the first through-hole 221 by the driving unit 202. By moving the second pin member 232 upward, the first pin member 231 is pressed by the second pin member 232 and moved upward. Hence, the first pin member 231 protrudes from the first surface 211, and the substrate W is lifted up.

The first through-hole 221 is larger on the second surface 212 side than on the first surface 211 side at least in the region where the second pin member 232 enters from the second surface 212.

Accordingly, even if the substrate W is lifted up in a state where the positions of the first through-hole 221 and the second through-hole 222 are displaced, the movement range of the displaced second pin member 232 that has entered the first through-hole 221 is within the first through-hole 221. Therefore, the damage to the second pin member 232 can be suppressed.

Figure 7A:
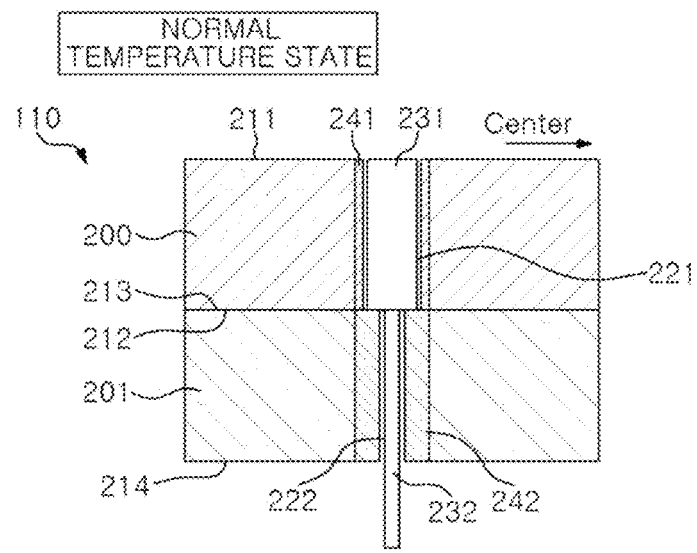
FIGS. 7A and 7B are simplified views showing further still another example of the configuration of the substrate support according to the embodiment.
Figure 7B:
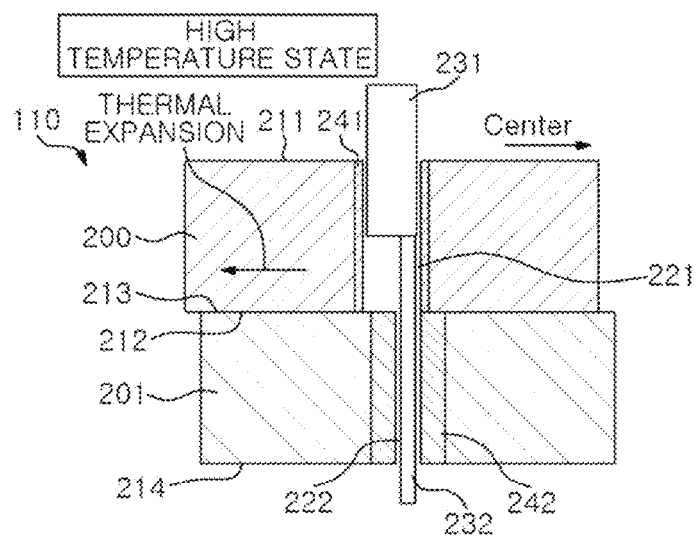

In the substrate support 110, the radius of one of the first pin member 231 and the second pin member 232 with respect to the displacement direction may be greater than the radius of the other pin member with respect to the displacement direction by the displacement width. FIGS. 7A and 7B are simplified views showing another example of the configuration of the substrate support 110 according to the embodiment. FIGS. 7A and 7B show the configuration in which the first lifter pin 172 is moved up and down. FIG. 7A shows a case where the axes of the first through-hole 221 and the second through-hole 222 are aligned in a predetermined normal temperature state. FIG. 7B shows a case where the first through-hole 221 is displaced to the left side with respect to the second through-hole 222 when the temperature becomes higher than the normal temperature state and the thermal expansion of the base 200 is greater than that of the support portion 201.

The radius of the first pin member 231 with respect to the displacement direction is greater than that of the second pin member 232 by the displacement width. The first through-hole 221 has a size corresponding to that of the first pin member 231. The second through-hole 222 has a size corresponding to that of the second pin member 232. In other words, in the base 200, the first through-hole 221 has an appropriate gap with respect to the first pin member 231.

In the support portion 201, the second through-hole 222 has an appropriate gap with respect to the second pin member 232.

In the case of lifting up the substrate W, the second pin member 232 is moved upward into the first through-hole 221 by the driving unit 202. By moving the second pin member 232 upward, the first pin member 231 is pressed by the second pin member 232 and moved upward. Accordingly, the first pin member 231 protrudes from the first surface 211, and the substrate W is lifted up.

The radius of the first pin member 231 with respect to the displacement direction is greater than the radius of the second pin member 232 with respect to the displacement direction by at least the displacement width. The first through-hole 221 has a size corresponding to that of the first pin member 231. Therefore, at least a space corresponding to the displacement width exists around the second pin member 232 that has entered the first through-hole 221. Accordingly, even if the substrate W is lifted up in a state where the positions of the first through-hole 221 and the second through-hole 222 are displaced, the movement range of the displaced second pin member 232 that has entered the first through-hole 221 is within the first through-hole 221. Hence, the damage to the second pin member 232 can be suppressed.

Figure 8A:
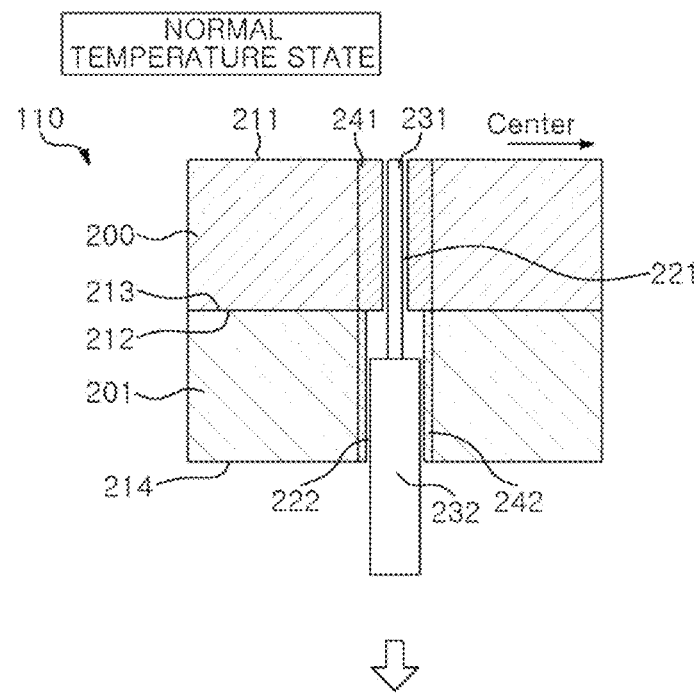
FIGS. 8A and 8B are simplified views showing further still another example of the configuration of the substrate support according to the embodiment.
Figure 8B:
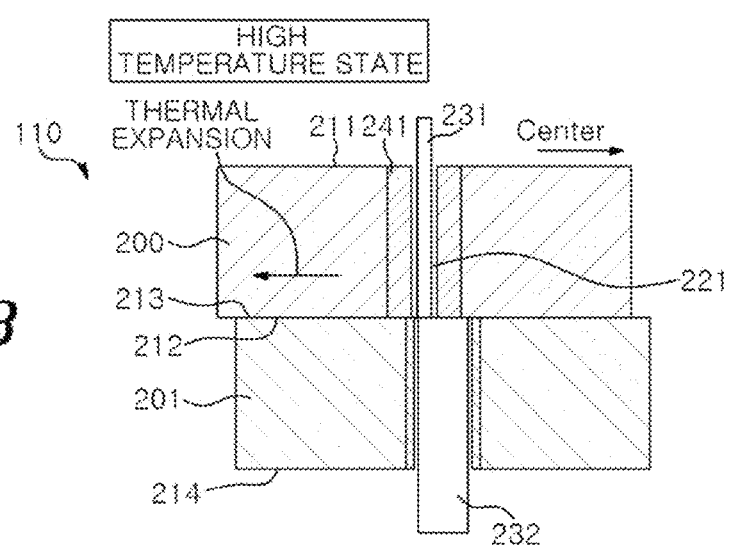

FIGS. 8A and 8B are simplified views showing another example of the configuration of the substrate support 110 according to the embodiment. FIGS. 8A and 8B show the configuration in which the first lifter pin 172 is moved up and down. FIG. 8A shows a case where the axes of the first through-hole 221 and the second through-hole 222 are aligned in a predetermined normal temperature state. FIG. 8B shows a case where the first through-hole 221 is displaced to the left side with respect to the second through-hole 222 when the temperature becomes higher than the normal temperature state and the thermal expansion of the base 200 is greater than that of the support portion 201.

The radius of the second pin member 232 with respect to the displacement direction is greater than the radius of the first pin member 231 with respect to the displacement direction by at least the displacement width. The first through-hole 221 has a size corresponding to that of the first pin member 231. The second through-hole 222 has a size corresponding to that of the second pin member 232. In other words, in the base 200, the first through-hole 221 has an appropriate gap with respect to the first pin member 231. In the support portion 201, the second through-hole 222 has an appropriate gap with respect to the second pin member 232.

The first pin member 231 has entered the second through-hole 222. In the case of lifting up the substrate W, the second pin member 232 is moved upward into the second through-hole 222 by the driving unit 202. By moving the second pin member 232 upward, the first pin member 231 is pressed by the second pin member 232 and moved upward. Accordingly, the first pin member 231 protrudes from the first surface 211, and the substrate W is lifted up.

The second through-hole 222 has a size corresponding to that of the second pin member 232. Thus, at least a space corresponding to the displacement width exists around the first pin member 231 that has entered the second through-hole 222. Accordingly, even if the substrate W is lifted up in a state where the positions of the first through-hole 221 and the second through-hole 222 are displaced, the movement range of the displaced first pin member 231 that has entered the second through-hole 222 is within the second through-hole 222. Therefore, the damage to the second pin member 232 can be suppressed.

As shown in FIGS. 7A and 7B, in the case of lifting up the substrate W, in the configuration in which the second pin member 232 is moved upward into the first through-hole 221, only the portion of the second pin member 232 that enters the first through-hole 221 may be formed to be thin. Further, as shown in FIGS. 8A and 8B, in the configuration in which the first pin member 231 enters the second through-hole 222, only the portion of the first pin member 231 that enters the second through-hole 222 may be formed to be thin.

Figure 9:
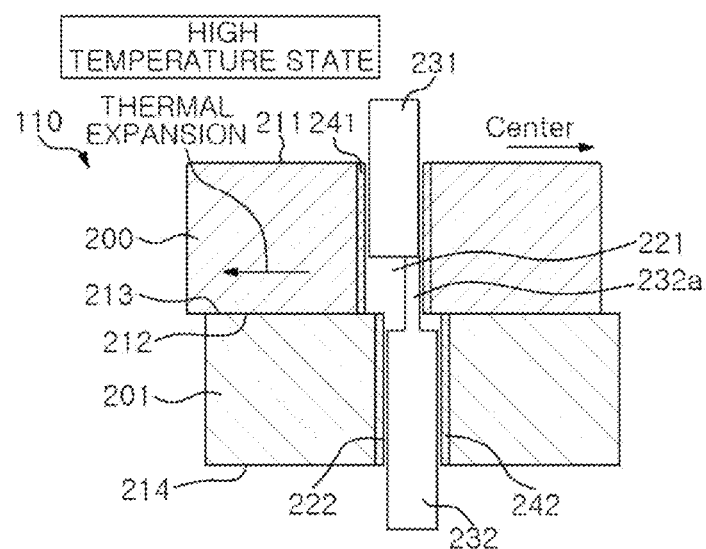
FIG. 9 is a simplified view showing further still another example of the configuration of the substrate support according to the embodiment.

FIG. 9 is a simplified view of another example of the configuration of the substrate support 110 according to the embodiment. Referring to FIG. 9, an upper portion 232a of the second pin member 232 that enters the first through-hole 221 in the configuration shown in FIGS. 7A and 7B is formed to be thin. In this case as well, a space corresponding to at least the displacement width exists around the upper portion 232a that has entered the first through-hole 221. Accordingly, even if the substrate W is lifted up in a state where the positions of the first through-hole 221 and the second through-hole 222 are displaced, the movement range of the upper portion 232a that has entered the first through-hole 221, which is obtained by the displacement, is within the first through-hole 221. Therefore, the damage to the second pin member 232 can be suppressed.

In the substrate support 110 according to the embodiment, when the substrate W or the edge ring 119 is raised, the second pin member 232 is moved upward by the driving unit 202, and the first pin member 231 is moved upward via the second pin member 232. Further, In the substrate support 110 according to the embodiment, when the substrate W or the edge ring 119 is lowered, the second pin member 232 is moved downward by the driving unit 202, and the first pin member 231 is moved downward by its self-weight. The first pin member 231 and the second pin member 232 are in contact with each other without being connected to each other. Therefore, the first pin member 231 is not lowered when the friction with the first through-hole 221 is strong or when the first pin member 231 is caught.

Therefore, in order to easily lower the first pin member 231, the first pin member 231 may be made of a high-density material.

Figure 10A:
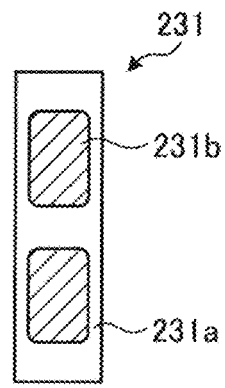
FIGS. 10A to 10F are simplified views showing examples of a configuration of a first pin member according to an embodiment.
Figure 10B:
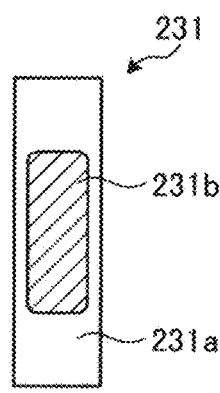
Figure 10C:
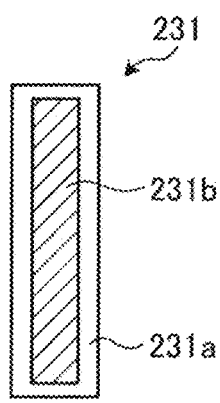
Figure 10D:
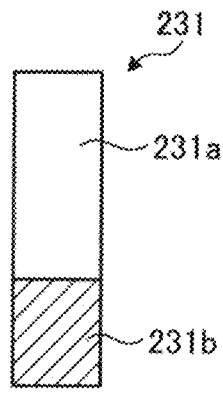
Figure 10E:
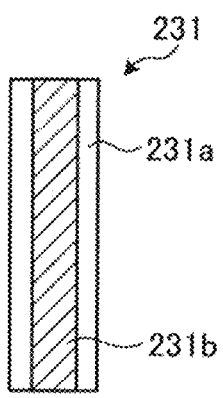

FIGS. 10A to 10F are simplified views showing the configuration of the first pin member 231 according to the embodiment. As shown in FIGS. 10A to 10C, a main material 231a of the first pin member 231 may contain a high-density material 231b. For example, the main material 231a may be resin such as Al, Ti, polyetheretherketone (PEEK), or the like. The high-density material 231b may be, e.g., Fe, W, and Al. For example, the main material 231a is Al, and the high-density material 231b is Fe. Alternatively, the main material 231a is Ti and the high-density material 231b is W. Alternatively, the main material 231a is PEEK, and the high-density material 231b is Al.

The first pin member 231 may be formed by adhering or joining the material 231a and the high-density material 231b. In the case of the first pin member 231 shown in FIG. 10D, the high-density material 231b is adhered or joined to the bottom of the material 231a. In the case of the first pin member 231 shown in FIG. 10E, the material 231a is adhered or joined around a rod-shaped high-density material 231b.

Figure 10F:
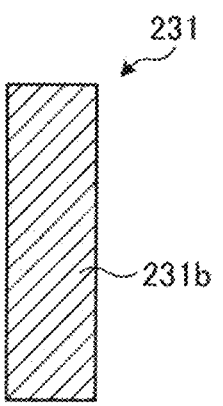

Further, the first pin member 231 may be made of a high-density material 231b. In FIG. 10F, the entire first pin member 231 is made of the high-density material 231b.

Since the first pin member 231 is made of the high-density material 231b, its self-weight increases. Accordingly, in the substrate support 110, the first pin member 231 can be easily lowered.

Further, in order to easily lower the first pin member 231, the first pin member 231 may be attracted toward the second pin member 232.

Figure 11A:
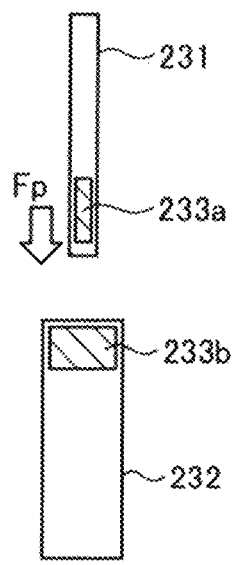
FIGS. 11A and 11B are simplified views showing examples of a configuration of the first pin member and a second pin member according to the embodiment.
Figure 11B:
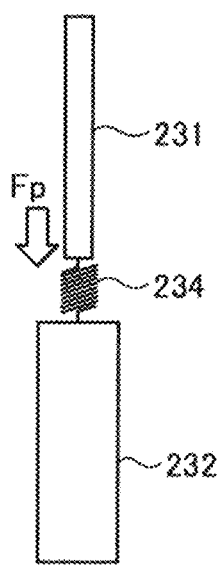

FIGS. 11A and 11B are simplified views showing the configuration of the first pin member 231 and the second pin member 232 according to the embodiment. In FIG. 11A, magnets 233a and 233b are disposed at the first pin member 231 and the second pin member 232, respectively, and the first pin member 231 and the second pin member 232 are attracted by a magnetic force. In FIG. 11A, the force that pulls the first pin member 231 downward by the magnets 233a and 233b is indicated by Fp. In FIG. 11B, the first pin member 231 and the second pin member 232 are connected by a connecting member 234 such as a spring or the like, and the first pin member 231 and the second pin member 232 are attracted. In FIG. 11B, the force that pulls the first pin member 231 downward by the connecting member 234 is indicated by Fp. The connecting member 234 may be a string or the like, instead of the spring. When the first pin member 231 and the second pin member 232 are configured as shown in FIGS. 11A and 11B, in the substrate support 110, the first pin member 231 can be pulled downward by lowering the second pin member 232 by the driving unit 202. As described above, in the substrate support 110, the first pin member 231 can be easily lowered by pulling the first pin member 231 toward the second pin member 232. One of the magnets 233a and 233b may be a magnet, and the other may be a magnetic material such as iron (Fe), nickel (Ni), or the like. Alternatively, at least one of the magnets 233a and 233b may be an electromagnet. In the case of an electromagnet, a magnetic force or a polarity can be switched, so that a descending speed can be adjusted by an attractive force or a repulsive force. Further, since the magnetic field leakage from the electromagnet may affect the uniformity of plasma generation, when plasma is generated without operation of the driving unit 202, it is preferable to turn off a power of the electromagnet to prevent generation of a magnetic force.

Further, the structure having a force for pulling the first pin member 231 downward is not limited to the self-weight, the magnetic force, the spring, and the string described in the embodiment. For example, it is also possible to employ a configuration in which electrodes are embedded in the first pin member 231 and the second pin member 232, and the first pin member 231 is attracted toward the second pin member 232 by an electrostatic force such as a Coulomb force or a Johnson Rahbek force generated by electrically charging the electrodes.

Figure 12:
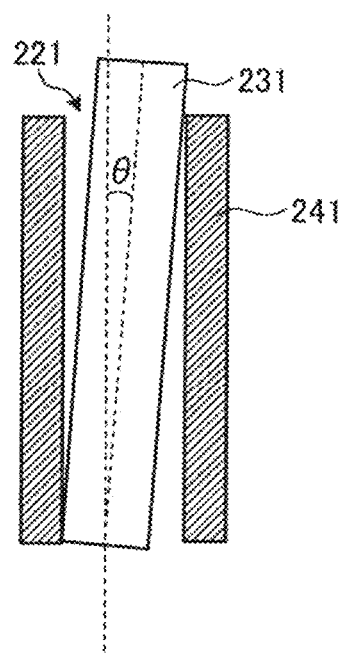
FIG. 12 explains friction between a first through-hole and the first pin member according to the embodiment.

FIG. 12 explains friction between the first through-hole 221 and the first pin member 231 according to the embodiment. For example, when there is a clearance between the first through-holes 221 and the first pin member 231, whether or not the first pin member 231 can be lowered is determined by the friction. For example, the first through-hole 221 has a constant diameter in a vertical direction. The first pin member 231 also has a constant diameter, and an angle of the first pin member 231 with respect to a vertical axis of the first through-hole 221 is set to θ.

In this case, a frictional resistance F applied to a friction portion where the first pin member 231 is in contact with the first through-hole 221 is expressed by the following Eq. (4).

$$F = \mu \cdot Mg \cos \theta \qquad \text{Eq. (4)}$$

Here, F indicates the frictional resistance.

μ indicates a coefficient of friction.

Mg indicates a weight of the first pin member 231.

The relational expression with the friction including the downward pulling force Fp is expressed by the following Eq. (5).

$$Fp + Mg > \mu \cdot Mg \cdot \cos \theta \qquad \text{Eq. (5)}$$

For example, when the first pin member 231 is lowered by its self-weight, a condition Fp=0 is satisfied. In this case, in Eq. (5), the coefficient of friction p needs to satisfy a condition μ<1/cos θ.

For example, as shown in FIG. 11B, when the first pin member 231 and the second pin member 232 are connected by the connecting member 234 and the connecting member 234 is a spring, the downward pulling force Fp satisfies a condition Fp=k·x. k indicates a spring constant. x indicates the amount of extension of the connecting member 234. In this case, in Eq. (5), the coefficient of friction μ needs to satisfy a condition μ<(k·x+Mg)/(Mg·cos θ).

For example, as shown in FIG. 11A, when magnets 233a and 233b are disposed at the first pin member 231 and the second pin member 232, respectively, and the first pin member 231 is lowered by the magnetic force, the downward pulling force Fp satisfies a condition Fp=k·m·(M+m)/r². k indicates a proportional constant. m indicates a mass of the second pin member 232. M indicates a mass of the first pin member 231. r indicates a distance between the magnets 233a and 233b. In this case, in Eq. (5), the coefficient of friction p needs to satisfy a condition μ<(k·m× (M+m)/r²+ Mg)/(Mg·cos θ).

Next, for example, when the clearance between the first through-holes 221 and the first pin member 231 is zero or is close to press fitting, it is determined whether or not the first pin member 231 can be lowered. In this case, a resistance $F_2$ applied to the friction portion where the first pin member 231 is in contact with the first through-hole 221 is expressed by the following Eq. (6).

$$F_2 = Pc \times 2\pi \cdot r_2 \times \qquad \text{Eq. (6)}$$

Here, $F_2$ indicates the resistance applied to the friction portion.

$P_C$ indicates an equilibrium pressure.

$r_2$ indicates an outer diameter of the first pin member 231.

L indicates a contact depth.

If a condition Mg>$F_2$ is satisfied, the first pin member 231 is lowered by its self-weight.

If the condition Mg<$F_2$ is satisfied, it is possible to assist the lowering of the first pin member 231 due to its self-weight by allowing the first pin member 231 to contain the high-density material 231b as shown in FIGS. 10A to 10F and by setting the mass of the first pin member 231 to $M_2$. When the condition $M_2$g>$F_2$ is satisfied, the first pin member 231 is lowered by its self-weight.

Figure 13A:
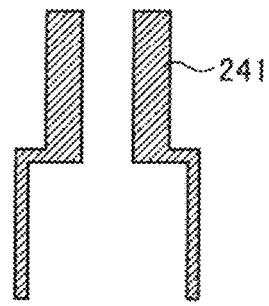
FIGS. 13A to 13D explain examples of a shape of a sleeve according to an embodiment.

In the substrate support 110, the resistance with the first pin member 231 can be adjusted by changing the material or the shape of the sleeve 241. FIGS. 13A to 13D explain examples of the shape of the sleeve 241 according to the embodiment. FIGS. 13A to 13D show variation in the shape of the sleeve 241 in the case where the substrate support 110 has the configuration shown in FIG. 2. In FIG. 13A, the sleeve 241 has a flat peripheral surface facing the first pin member 231 and is in contact with the first pin member 231 on the entire peripheral surface thereof. Even when the contact area with the first pin member 231 is large as shown in FIG. 13A, the resistance can be adjusted by changing the material of the sleeve 241. The sleeve 241 may be made of, e.g., polytetrafluoroethylene (PTFE), PEEK, ceramic, or the like. The gap between the sleeve 241 and the first pin member 231 is set based on a general fitting tolerance, and is set to a clearance of 0 mm or more depending on using conditions.

Figure 13B:
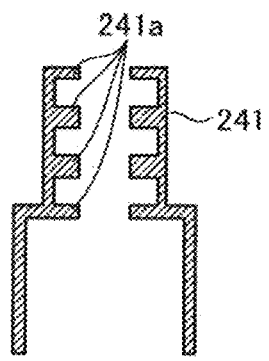
Figure 13C:
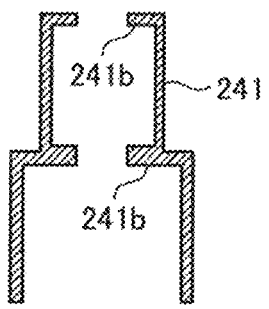
Figure 13D:
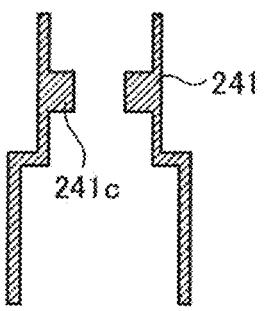

In FIG. 13B, the sleeve 241 is alternately uneven in the axial direction on a peripheral surface facing the first pin member 231, and is in contact with the first pin member 231 at convex portions 241a. In FIG. 13C, the sleeve 241 has convex portions 241b formed at an upper portion and a lower portion of the peripheral surface facing the first pin member 231, and is in contact with the first pin member 231 at the upper and lower convex portions 241b. In FIG. 13D, the sleeve 241 has convex portions 241c formed at the center of the peripheral surface facing the first pin member 231 and is in contact with the first pin member 231 at the central convex portions 241c. As shown in FIGS. 13B to 13D, the resistance with the first pin member 231 may be adjusted by changing the contact area with the first pin member 231.

In the substrate support 110 according to the present embodiment, as in the conventional case, it is not necessary to form a large first through-hole 221 in the first pin member 231 in consideration of the positional displacement of the first through-hole 221 and the second through-hole 222. Therefore, the clearance between the sleeve 241 and the first pin member 231 can be minimized.

In the substrate support 110, the accuracy of the installation position of the substrate W or the edge ring 119 placed on the substrate support 110 can be improved by minimizing the clearance between the sleeve 241 and the first pin member 231. For example, it is required to accurately arrange the edge ring 119 such as a focus ring, a cover ring, or the like with respect to the electrostatic chuck 120 because the arrangement of the edge ring 119 may affect the process or cause arcing. In the substrate support 110 according to the present embodiment, the clearance between the sleeve 241 and the first pin member 231 can be minimized, so that the edge ring 119 can be accurately arranged with respect to the electrostatic chuck 120. Further, the electrostatic chuck 120 is disposed on the base 200 and expands/contracts together with the base 200. Therefore, even when the temperature of the electrostatic chuck 120 changes from a low temperature to a high temperature, the edge ring 119 can be accurately arranged with respect to the electrostatic chuck 120 by arranging the edge ring 119 with reference to the position of the first pin member 231.

Further, in the substrate support 110, it is expected to suppress abnormal discharge by minimizing the clearance between the sleeve 241 and the first pin member 231. It is considered that the abnormal discharge occurs when the space between the first pin member 231 and the first through-hole 221 is filled with a gas and a potential difference is generated. In the substrate support 110 according to the embodiment, the clearance between the sleeve 241 and the first pin member 231 can be minimized, so that the abnormal discharge can be suppressed.

Figure 14A:
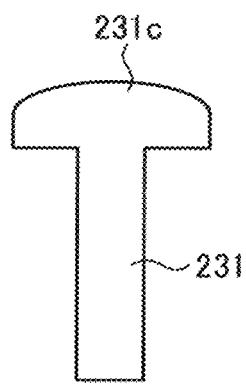
FIGS. 14A and 14B explain an example of the shape of the first pin member according to the embodiment.
Figure 14B:
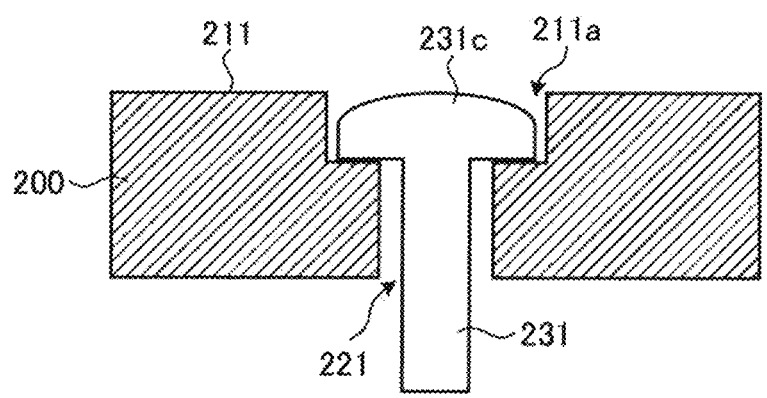

The shape of the tip end of the first pin member 231 on the first surface 211 side may be changed. FIGS. 14A and 14B explain an example of the shape of the first pin member 231 according to the embodiment. In FIG. 14A, the first pin member 231 has a head portion 231c having an umbrella structure in which a width of a tip end on the first surface 211 side is widened. The first surface 211 side of the first through-hole 221 may be covered with the head portion 231c of the first pin member 231. FIG. 14B shows a state in which the first surface 211 side of the first through-hole 221 is covered with the head portion 231c of the first pin member 231. The first through-hole 221 may have a recess 211a on the first surface 211 side to prevent the upper end of the first pin member 231 from protruding. By covering the first surface 211 side of the first through-hole 221 with the first pin member 231, it is possible to suppress the entrance of a gas into the space between the first pin member 231 and the first through-hole 221. Accordingly, the risk of abnormal discharge can be reduced.

Figure 15A:
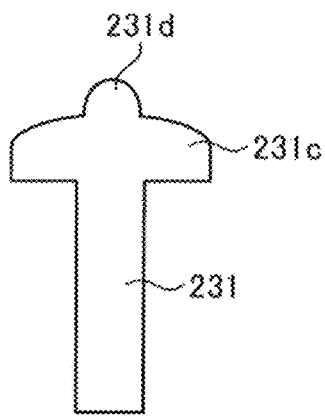
FIGS. 15A to 15C explain examples of the shape of the first pin member according to the embodiment.
Figure 15B:
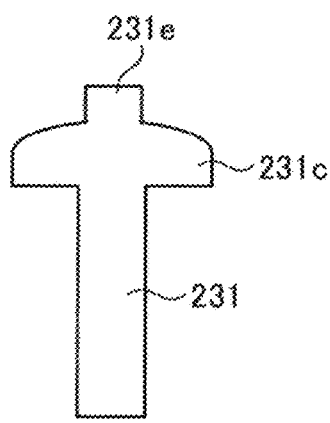
Figure 15C:
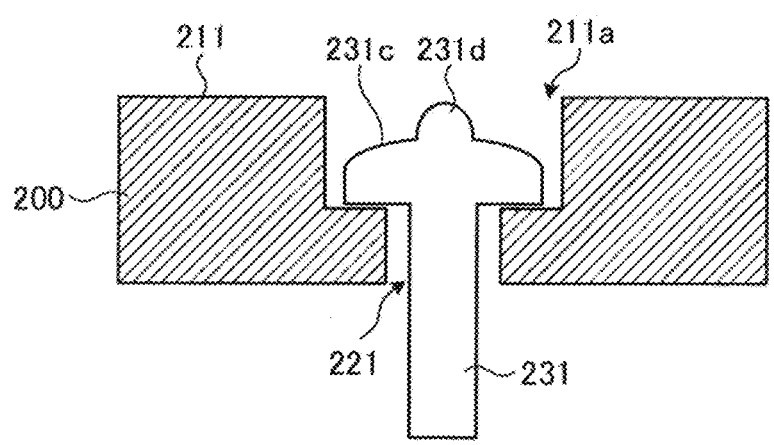
Figure 16:
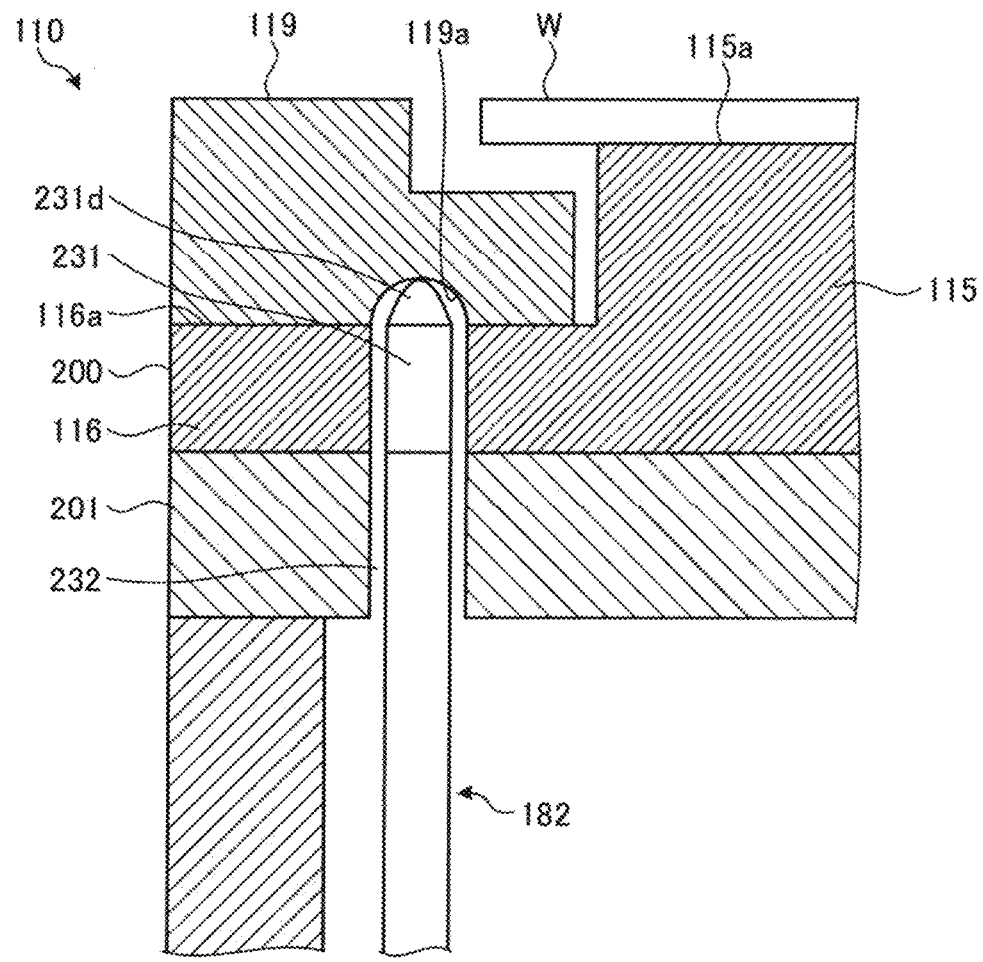
FIG. 16 explain an example of a shape of an edge ring according to an embodiment.

Further, the first pin member 231 may have a positioning protrusion at the tip end on the first surface 211 side. FIGS. 15A to 15C explain examples of the shape of the first pin member 231 according to the embodiment. In FIG. 15A, the first pin member 231 has a hemispherical protrusion 231d for positioning at the tip end of the head portion 231c in which a width of a tip end on the first surface 211 side is widened. In FIG. 15B, the first pin member 231 has a rectangular protrusion 231e for positioning at the tip end of the head portion 231c disposed at the tip end on the first surface 211 side. FIG. 15c shows a state in which the first surface 211 side of the first through-hole 221 is covered with the first pin member 231. The first through-hole 221 has the recess 211a on the first surface 211 side to prevent the upper end of the first pin member 231 from protruding from the first surface 211. Since the first pin member 231 has the protrusion 231d, the substrate W or the edge ring 119 can be arranged with high accuracy. The substrate W or the edge ring 119 may have a recess for positioning to correspond to the position of the first pin member 231. FIG. 16 explains an example of the shape of the edge ring 119 according to the embodiment. The second lifter pin 182 is divided into a first pin member 231 and a second pin member 232. The first pin member 231 has the protrusion 231d. The edge ring 119 has a recess 119a for positioning to correspond to the position of the first pin member 231. Accordingly, the edge ring 119 can be arranged with high accuracy.

Further, in the substrate support 110, the first lifter pin 172 or the second lifter pin 182 can be easily attached due to the configuration in which the first lifter pin 172 or the second lifter pin 182 is divided into the first pin member 231 and the second pin member 232. The first lifter pin 172 or the second lifter pin 182 need to be attached to the driving unit 202 so as to be vertically movable. On the other hand, when the first lifter pin 172 or the second lifter pin 182 has the head portion 231c in which the width of the tip end is widened, the first lifter pin 172 or the second lifter pin 182 can inserted into the first through-hole 221 only from the first surface 211 side. In this case, the first lifter pin 172 or the second lifter pin 182 is inserted into the first through-hole 221 of the substrate support 110 from the first surface 211 side, and then attached to the driving unit 202. In order to realize such attachment, the driving unit 202 requires a mechanism for automatically clamping the end portion of the first lifter pin 172 or the second lifter pin 182, for example. On the other hand, the substrate support 110 according to the present embodiment has the configuration in which the first lifter pin 172 or the second lifter pin 182 is divided into the first pin member 231 and the second pin member 232. Since the first pin member 231 and the second pin member 232 are only in contact with each other, they can be separately attached to the substrate support 110. For example, when the first pin member 231 has the head portion 231c in which the width of the tip end is widened, the first pin member 231 can be inserted into the first through-hole 221 only from the first surface 211 side. However, in the substrate support 110 according to the present embodiment, the attachment can be easily realized by separately attaching the first pin member 231 and the second pin member 232. For example, one end of the second pin member 232 is attached to the driving unit 202 and, then, the other end of the second pin member 232 is inserted into the second through-hole 222 of the substrate support 110 from the fourth surface 214 side. Then, the first pin member 231 is inserted into the first through-hole 221 of the substrate support 110 from the first surface 211 side. In the substrate support 110 according to the present embodiment, the attachment can be easily realized by inserting only the first pin member 231 into the first through-hole 221 of the substrate support 110 from the first surface 211 side.

Figure 17:
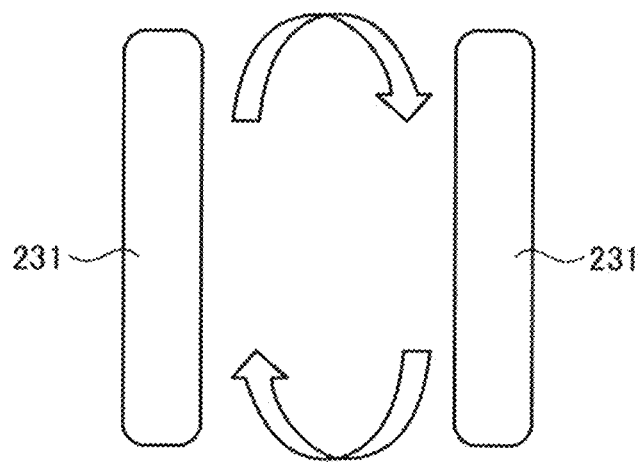
FIG. 17 explains an example of the shape of the first pin member according to the embodiment.

The first pin member 231 may have a similar rod shape at both ends. FIG. 17 explains an example of the shape of the first pin member 231 according to the embodiment. Both ends of the first pin member 231 have a similar rod shape. Since both ends of the first pin member 231 have the same shape, the first pin member 231 can be used upside down. For example, when one end of the first pin member 231 is worn out, the first pin member 231 can be reversed upside down and used further.

Figure 18A:
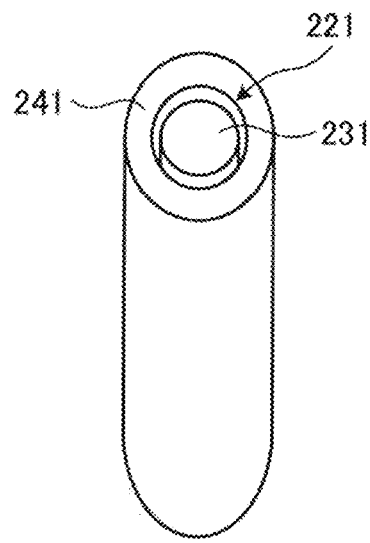
FIGS. 18A and 18B explain an example of the configuration of the first pin member and the first through-hole according to the embodiment.
Figure 18B:
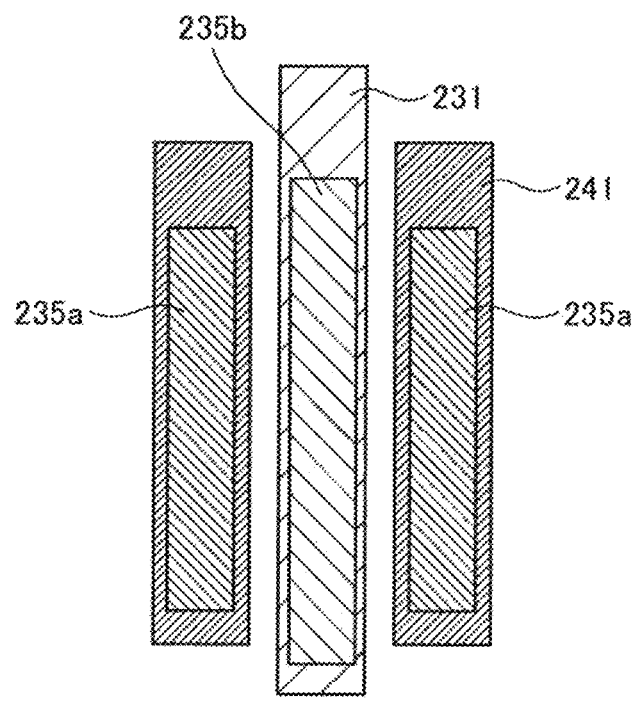

The first pin member 231 may be separated from the first through-hole 221 to reduce the friction with the contact surface of the first through-hole 221. FIGS. 18A and 18B explain an example of the configuration of the first pin member 231 and the first through-hole 221 according to the embodiment. The first through-hole 221 is provided with the sleeve 241 to surround the periphery of the first pin member 231. The magnets 235a and 235b are disposed inside the first pin member 231 and the sleeve 241, respectively, to generate repulsive forces. Accordingly, the first pin member 231 can be separated from the first through-hole 221 by the repulsive force from the sleeve 241 and located at the center of the first through-hole 221. One of the magnets 235a and 235b may be a magnet, and the other may be a magnetic material such as iron (Fe), nickel (Ni), or the like. Alternatively, at least one of the magnets 235a and 235b may be an electromagnet. Further, since the magnetic field leakage from the electromagnet may affect the uniformity of plasma generation, when plasma is generated without operation of the driving unit 202, it is preferable to turn off a power of the electromagnet to prevent generation of a magnetic force.

When the plasma processing is performed, the processing chamber 102 where the substrate support 110 is disposed is exhausted and depressurized by the exhaust 105. As shown in FIG. 3 and the like, when the substrate support 110 has the configuration in which the first pin member 231 and the second pin member 232 are only in contact with each other without being connected to each other, the first pin member 231 is not fixed, so that the first pin member 231 may protrude upward when the pressure is reduced.

Therefore, the substrate support 110 according to the embodiment may have the following configuration to prevent the first pin member 231 from protruding.

Figure 19A:
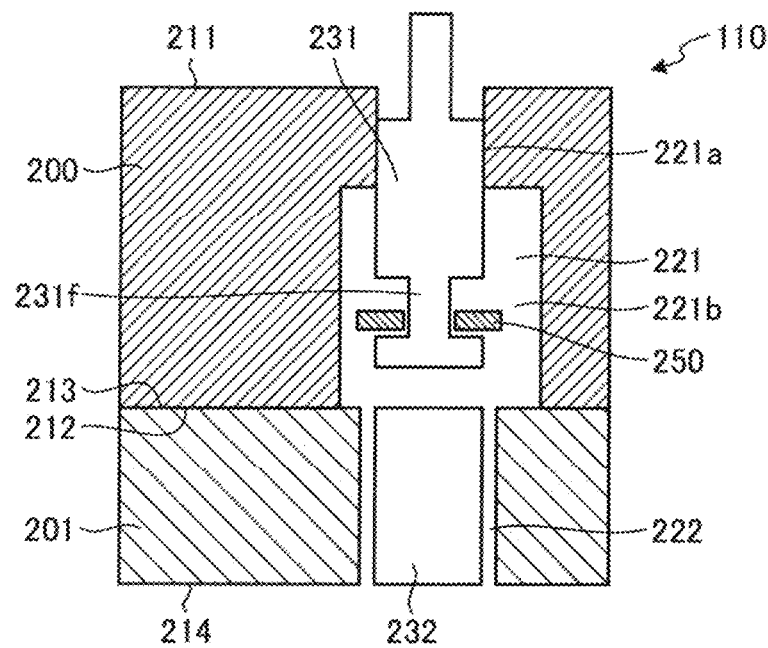
FIG. 19A schematically illustrates another example of the configuration of the substrate support according to the embodiment.

FIG. 19A schematically illustrates another example of the configuration of the substrate support 110 according to the embodiment. FIG. 19A shows a configuration for raising and lowering the first lifter pin 172. FIG. 19A illustrates a case in which the axes of the first through-hole 221 and the second through-hole 222 are aligned in a predetermined normal temperature state.

The first through-hole 221 is larger on the second surface 212 side than on the first surface 211 side. In other words, in the base 200, the diameter of the first through-hole 221 is larger on the second surface 212 side than the first surface 211 side. Hereinafter, the first surface 211 side in which the diameter of the first through-hole 221 is not expanded is referred to as "first section 221a" and the second surface 212 side in which the diameter of the first through-hole 221 is expanded is referred to as "second section 221b."

The first pin member 231 is stored in the first through-hole 221 and is movable in the axial direction of the first through-hole 221. The first pin member 231 is formed in a rod shape having a radius corresponding to the first section 221a on the upper side of the first through-hole 221. The first pin member 231 is formed to be thin on the first surface 211 side.

The second pin member 232 is formed in a rod shape having a radius corresponding to the second through-hole 222. The second pin member 232 is stored in the second through-hole 222 and is movable in the axial direction of the second through-hole 222. An end portion of the second pin member 232 on the third surface 213 side is slidably in contact with the first pin member 231.

In the substrate support 110 shown in FIG. 19A, when the substrate W is lifted up, the second pin member 232 moves upward and enters the first through-hole 221. Due to the upward movement of the second pin member 232, the first pin member 231 is pressed by the second pin member 232 and moved upward. Accordingly, the first pin member 231 protrudes from the first surface 211, and the substrate W is lifted up.

The first through-hole 221 is larger on the second surface 212 side than on the first surface 211 side at least in the region where the second pin member 232 enters from the second surface 212. For example, the radius of the first through-hole 221 is larger on the second surface 212 side than on the first surface 211 side by the positional displacement ΔR at least in the region where the second pin member 232 enters from the second surface 212.

A ring 250 is attached to the vicinity of the end portion of the first pin member 231 on the second surface 212 side. An outer diameter of the ring 250 is larger than the diameter of the first section 221a on the upper side of the first through-hole 221 and smaller than the diameter of the second section 221b.

Figure 19B:
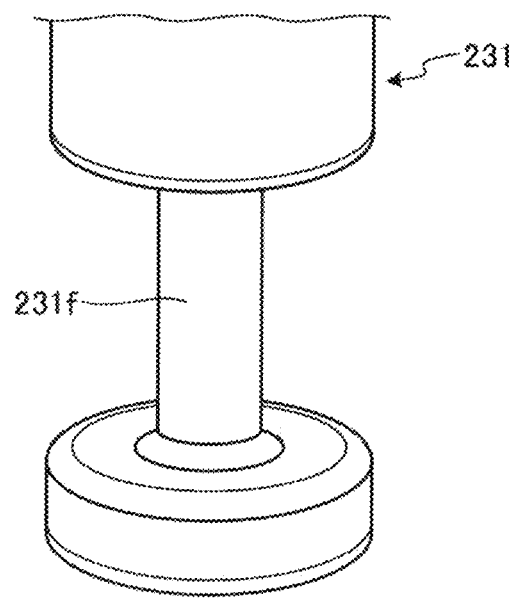
FIG. 19B schematically illustrates an example of the configuration of the first pin member according to the embodiment.
Figure 19C:
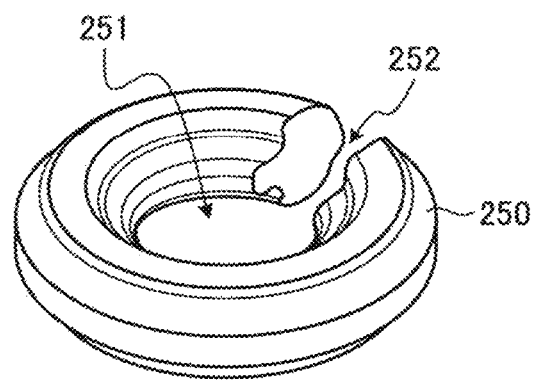
FIG. 19C illustrates an example of a configuration of a ring according to an embodiment.
Figure 19D:
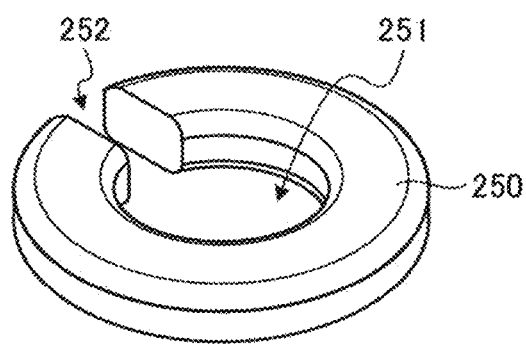
FIG. 19D illustrates another example of the configuration of the ring according to the embodiment.

FIG. 19B schematically illustrates an example of the configuration of the first pin member 231 according to the embodiment. FIG. 19B illustrates a vicinity of the end portion of the first pin member 231 on the second surface 212 side. The first pin member 231 has a thin attaching portion 231f. FIG. 19C illustrates an example of the configuration of the ring 250 according to the embodiment. The ring 250 is formed in an annular shape having a hole 251 at its center. The hole 251 of the ring 250 has a diameter that is substantially the same as the diameter of the attaching portion 231f of the first pin member 231. The ring 250 has a cutoff portion 252 formed by cutting a part of the ring 250. The ring 250 is recessed at the center thereof, and the periphery of the hole 251 is formed in a tapered shape. When the end portion of the first pin member 231 is aligned with the hole 251 and press-fitted, the cutoff portion 252 of the ring 250 is widened, which makes it possible to attach the ring 250 to the first pin member 231. In addition, the ring 250 may be formed in a flat annular shape. FIG. 19D shows another example of the configuration of the ring 250 according to the embodiment. FIG. 19D illustrates a case in which the ring 250 is formed in a flat annular shape.

In the substrate support 110 shown in FIG. 19A, in the case of attaching the first pin member 231 and the second pin member 232, the first pin member 231 is inserted into the first through-hole 221 from the first surface 211 side. Then, the end portion of the first pin member 231 that has passed through the first through-hole 221 is aligned with the hole 251 of the ring 250 and press-fitted, thereby attaching the ring 250 to the first pin member 231. Therefore, for example, even when the pressure in the processing chamber 102 is reduced and the first pin member 231 is pulled upward, the first pin member 231 cannot be raised due to the engagement between the ring 250 and the first section 221a of the first through-hole 221. Accordingly, the substrate support 110 shown in FIG. 19A can prevent the first pin member 231 from protruding. In addition, since the substrate support 110 has a simple configuration in which the ring 250 is attached to the first pin member 231, an increase in a manufacturing cost can be suppressed.

Further, the substrate support 110 according to the embodiment may have the following configuration to prevent the first pin member 231 from protruding and facilitate the lowering of the first pin member 231.

Figure 20A:
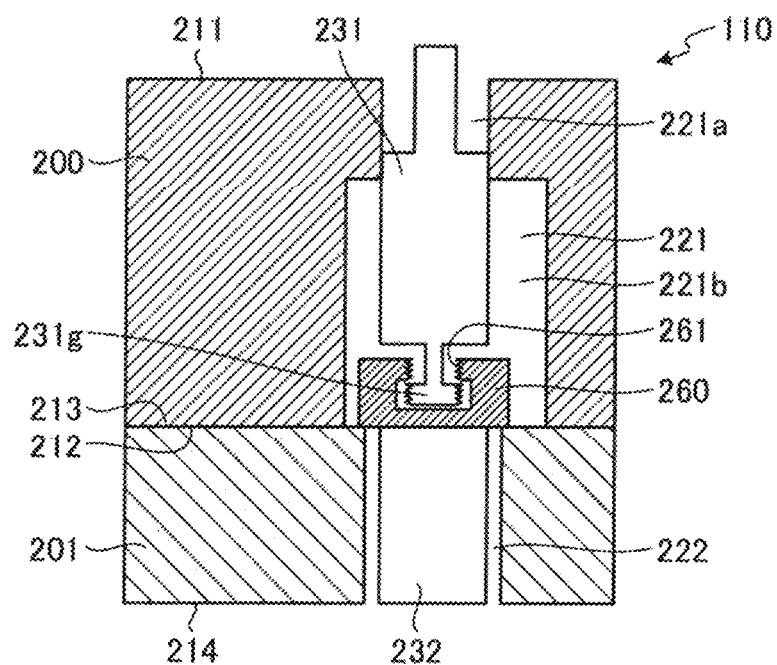
FIG. 20A schematically illustrates another example of the configuration of the substrate support according to the embodiment.

FIG. 20A schematically illustrates another example of the configuration of the substrate support 110 according to the embodiment. FIG. 20A shows a configuration for raising and lowering the first lifter pin 172. FIG. 20A shows a case in which the axes of the first through-hole 221 and the second through-hole 222 are aligned in a predetermined normal temperature state. Since the substrate support 110 shown in FIG. 20A has partially the same configuration as that of the substrate support 110 shown in FIG. 19A, redundant description thereof will be omitted by assigning like reference numerals to like parts, and differences will be mainly described.

The first pin member 231 has a head portion 231g formed at a lower end thereof. The head portion 231g is formed in a cylindrical shape, and a screw thread is formed on a circumferential surface thereof.

A connection part 260 is disposed at an upper end of the second pin member 232. The connection part 260 has a hollow structure having a space therein, and a hole 261 is formed in an end surface on the first pin member 231 side. A screw groove is formed on a circumferential surface of the hole 261.

Figure 20B:
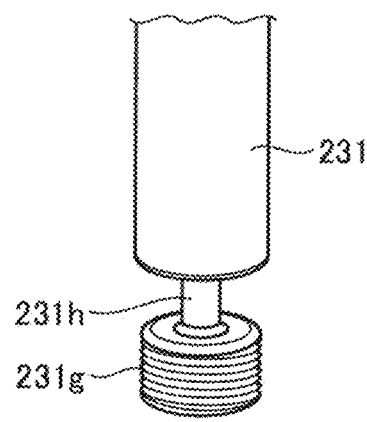
FIG. 20B schematically illustrates an example of the configuration of the first pin member according to the embodiment.

FIG. 20B schematically illustrates an example of the configuration of the first pin member 231 according to the embodiment. FIG. 20B illustrates a vicinity of the end portion of the first pin member 231 on the second surface 212 side. The first pin member 231 has a head portion 231g at a lower end thereof. The head portion 231g is formed in a cylindrical shape, and a screw thread is formed on a circumferential surface thereof. Further, the first pin member 231 has a thin attaching portion 231h provided with the head portion 231g.

Figure 20C:
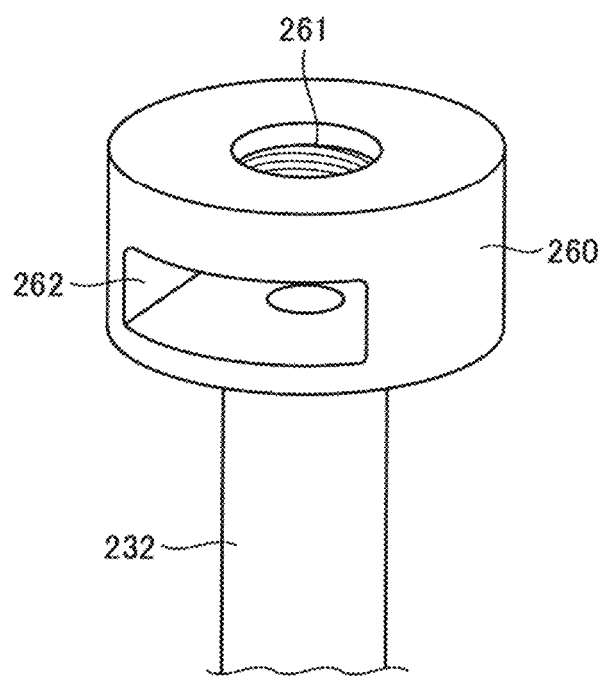
FIG. 20C illustrates an example of a configuration of a connection part according to an embodiment.

FIG. 20C illustrates an example of the configuration of the connection part 260 according to the embodiment. The connection part 260 has a hole 261 formed in an end surface on the first pin member 231 side. The connection part 260 has a hollow structure having a space therein. The inner space of the connection part 260 communicates with the hole 261 and a hole 262 formed on a side surface. The inner space of the connection part 260 is wider than the size of the head portion 231g. The hole 261 has a diameter that is substantially the same as that of the head portion 231g, and a screw groove is formed on a circumferential surface thereof.

Figure 20D:
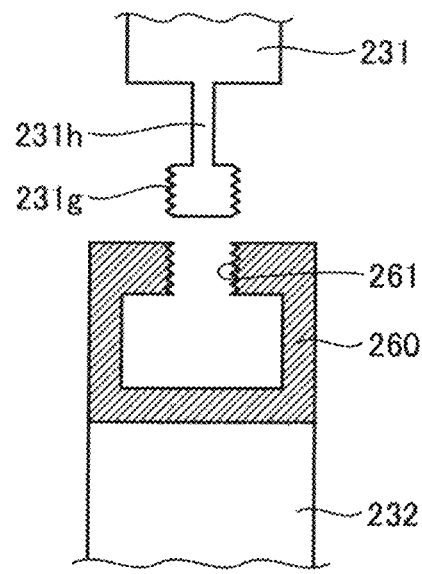
FIGS. 20d and 20e explain an example of a sequence of connecting the first pin member and the second pin member according to the embodiment.
Figure 20E:
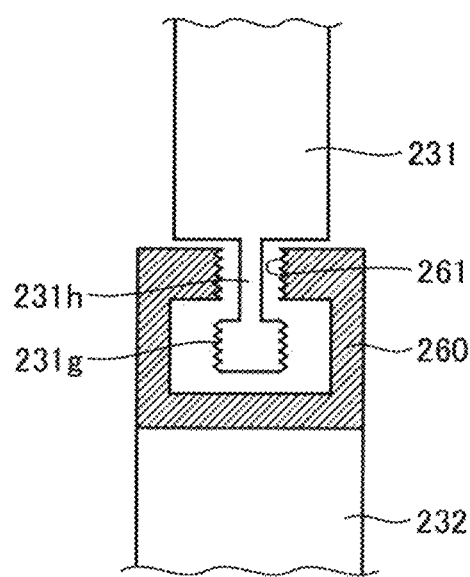

FIGS. 20D and 20E explain an example of a sequence of connecting the first pin member 231 and the second pin member 232 according to the embodiment. In the case of connecting the first pin member 231 and the second pin member 232, the head portion 231g of the first pin member 231 is aligned with the hole 261 of the connection part 260, and the first pin The member 231 is rotated in the circumferential direction. Accordingly, the screw thread of the head portion 231g and the screw groove of the hole 261 of the connection part 260 are engaged, and the head portion 231g enters the hole 261. When the first pin member 231 is rotated in the circumferential direction, the head portion 231g of the first pin member 231 passes through the hole 261 of the connection part 260, and the head portion 231g reaches the space in the connection part 260, as shown in FIG. 20E. Accordingly, the first pin member 231 and the second pin member 232 are connected. Since the head portion 231g is engaged with the hole 261, the head portion 231g is not separated from the hole 261 even when it is located in the hole 261. The first pin member 231 has the attaching portion 231h formed in a range where the hole 261 is located when the head portion 231g reaches the space in the connection part 260. Accordingly, when the head portion 231g reaches the space in the connection part 260, a gap is formed between the circumferential surface of the hole 261 and the attaching portion 231h. Due to the gap between the circumferential surface of the hole 261 and the attaching portion 231h, the first pin member 231 and the second pin member 232 can be connected to be movable.

In the substrate support 110 shown in FIG. 20A, in the case of attaching the first pin member 231 and the second pin member 232, the end portion of the second pin member 232 opposite to the connection part 260 is inserted into the second through-hole 222 of the substrate support 110 from the third surface 213 side. Then, the end portion that has passed through the second through-hole 222 is attached to the driving unit 202. After the end portion of the second pin member 232 opposite side to the connection part 260 is attached to the driving unit 202, the end portion of the second pin member 232 on the connection part 260 side may be inserted into the second through-hole 222 of the substrate support 110 from the fourth surface 214 side.

The head portion 231g of the first pin member 231 is inserted into the first through-hole 221 of the substrate support 110 from the first surface 211 side. Then, the head portion 231g of the first pin member 231 is aligned with the hole 261 of the connection part 260, and the first pin member 231 is rotated in the circumferential direction until the head portion 231g reaches the space in the connection part 260. Therefore, the first pin member 231 and the second pin member 232 are connected by the connection part 260. Accordingly, for example, even when the pressure in the processing container 102 is reduced and the first pin member 231 is pulled upward, the first pin member 231 cannot be raised because it is connected to the second pin member 232. Hence, the substrate support 110 shown in FIG. 20A can prevent the first pin member 231 from protruding. Further, the substrate support 110 can facilitate the lowering of the first pin member 231 by connecting the first pin member 231 and the second pin member 232. Further, in the substrate support 110, the head portion 231g can be separated from the hole 261 by aligning the head portion 231g with the hole 261 of the connection part 260 and rotating the first pin member 231 in a reverse direction of the circumferential direction for connecting the first pin member 231. Accordingly, in the substrate support 110, the connection between the first pin member 231 and the second pin member 232 can be released.

Further, the substrate support 110 according to the embodiment may have the following configuration to prevent the first pin member 231 from protruding and facilitate the lowering of the first pin member 231.

Figure 21A:
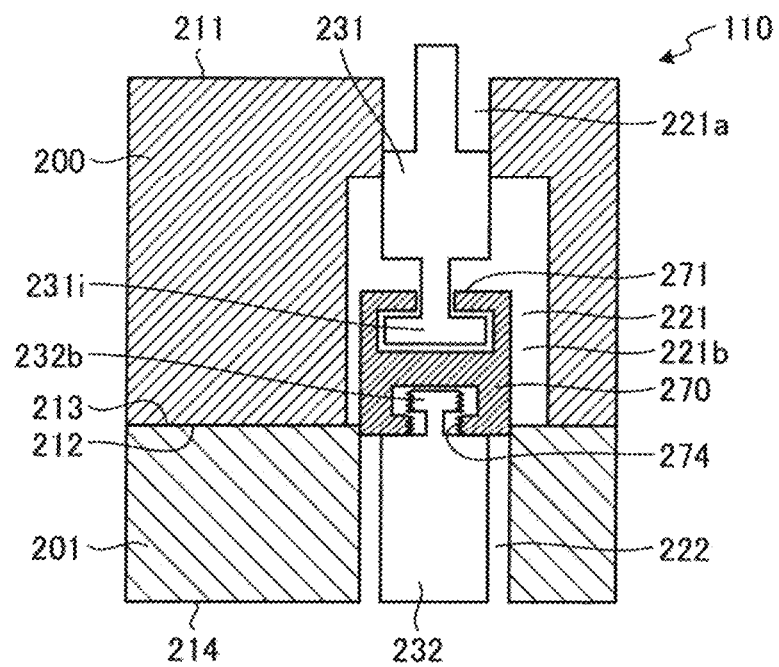
FIG. 21A schematically illustrates another example of the configuration of the substrate support according to the embodiment.

FIG. 21A schematically illustrates another example of the configuration of the substrate support 110 according to the embodiment. FIG. 21A shows a configuration for raising and lowering the first lifter pin 172. FIG. 21A illustrates a case in which the axes of the first through-hole 221 and the second through-hole 222 are aligned in a predetermined normal temperature state. Since the substrate support 110 shown in FIG. 21A has partially the same configuration as that of the substrate support 110 shown in FIGS. 19A and 20A, redundant description thereof will be omitted by assigning like reference numerals to like parts, and difference will be mainly described.

The first pin member 231 has a first head portion 231i at the lower end thereof. The first head portion 231i is formed in a cylindrical shape.

The second pin member 232 has a second head portion 232b at an upper end thereof. The second head portion 232b is formed in a cylindrical shape, and a screw thread is formed on a circumferential surface thereof.

The first pin member 231 and the second pin member 232 are connected by a connection part 270. The connection part 270 is provided with a coupling portion 271 to be connected to the first head portion 231i on the first pin member 231 side. Further, the connection part 270 has a hollow structure having a space therein, and a hole 274 is formed in an end surface on the second pin member 232 side. A screw groove is formed on a circumferential surface of the hole 274.

Figure 21B:
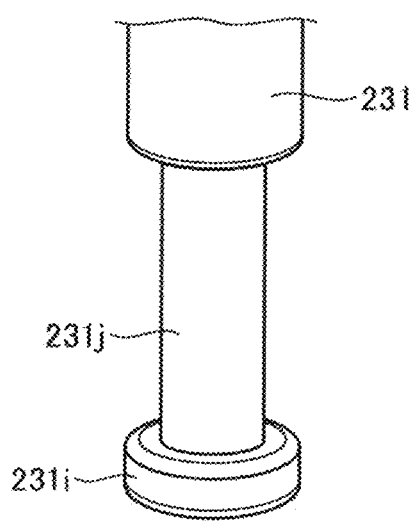
FIG. 21B schematically illustrates an example of the configuration of the first pin member according to the embodiment.

FIG. 21B schematically illustrates an example of the configuration of the first pin member 231 according to the embodiment. FIG. 21B illustrates a vicinity of the end portion of the first pin member 231 on the second surface 212 side. The first pin member 231 has the first head portion 231i at the lower end thereof. Further, the first pin member 231 has a thin first attaching portion 231j provided with the first head portion 231i.

Figure 21C:
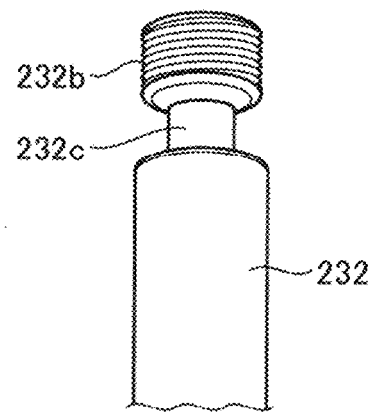
FIG. 21C schematically illustrates an example of the configuration of the second pin member according to the embodiment.

FIG. 21C schematically illustrates an example of the configuration of the second pin member 232 according to the embodiment. FIG. 21C shows a vicinity of the end portion of the second pin member 232 on the third face 213 side. The second pin member 232 has the second head portion 232b at the upper end thereof. The second head portion 232b is formed in a cylindrical shape, and a screw thread is formed on a circumferential surface thereof. Further, the second pin member 232 has a thin second attaching portion 232c provided with the second head portion 232b.

Figure 21D:
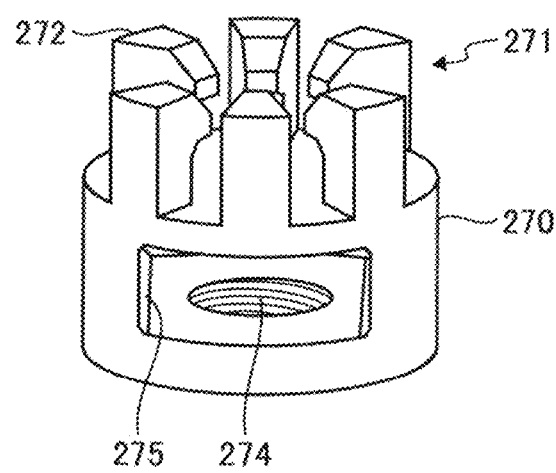
FIG. 21D illustrates an example of the configuration of the connection part according to the embodiment.

FIG. 21D illustrates an example of the configuration of the connection part 270 according to the embodiment. The connection part 270 is provided with the coupling portion 271 formed in an end surface on the first pin member 231 side. The coupling portion 271 has a plurality of upwardly protruding claw portions 272 arranged in a circular shape. The tip ends of the claw portions 272 face inward. In the connection part 270, the end portion of the first pin member 231 is aligned with the center of the plurality of claw portions 272 arranged in a circular shape and press-fitted, so that the tip ends of the claw portions 272 are temporarily widened outward and returned, which makes it possible to hold the first pin member 231 with the plurality of claw portions 272. Accordingly, the first pin member 231 and the connection part 270 are connected. The connection part 270 can be connected to the first pin member 231 while allowing the movement of the first pin member 231 held by the claw portions 272 due to the elastic deformation of the claw portions 272.

Further, the connection part 270 has a hole 274 formed in an end surface on the second pin member 232 side. The hole 274 has a diameter that is substantially the same as that of the second head portion 232b, and a screw groove is formed on a circumferential surface thereof. The connection part 270 has a hollow structure having a space therein. An inner space of the connection part 270 communicates with the hole 274 and a hole 275 formed on a side surface. The inner space of the connection part 270 is wider than the size of the second head portion 232b. The hole 274 has the same diameter as that of the second head portion 232b, and a screw groove is formed on a circumferential surface thereof.

In the substrate support 110 shown in FIG. 21A, in the case of attaching the first pin member 231 and the second pin member 232, the first head portion 231i of the first pin member 231 is inserted into the first through-hole 221 of the substrate support 110 from the first surface 211 side. The first pin member 231 is inserted into the first through-hole 221 from the first surface 211 side. Then, the first head portion 231i of the first pin member 231 that has passed through the first through-hole 221 is engaged with the coupling portion 271 of the connection part 270 and press-fitted, thereby attaching the connection part 270.

Further, the end portion of the second pin member 232 opposite to the second head portion 232b is inserted into the second through-hole 222 of the substrate support 110 from the third surface 213 side. Then, the end portion that has passed through the second through-hole 222 is attached to the driving unit 202. Further, after the end portion of the second pin member 232 opposite to the second head portion 232b is attached to the driving unit 202, the end portion of the second pin member 232 on the second head portion 232b side may be inserted into the second through-hole 222 of the substrate support 110 from the fourth surface 214 side.

Then, the second head portion 232b of the second pin member 232 is aligned with the hole 274 of the connection part 270, and the second head portion 232b is rotated in the circumferential direction until the second head portion 232b reaches the space in the connection part 270. Accordingly, the first pin member 231 and the second pin member 232 are connected by the connection part 270. Hence, for example, even when the pressure in the processing container 102 is reduced and the first pin member 231 is pulled upward, the first pin member 231 cannot be raised because it is connected to the second pin member 232. In this manner, the substrate support 110 shown in FIG. 21A can prevent the first pin member 231 from protruding. Further, the substrate support 110 can facilitate the lowering of the first pin member 231 by connecting the first pin member 231 and the second pin member 232. Further, in the substrate support 110, the second head portion 232b can be separated from the hole 274 by aligning the second head portion 232b with the hole 274 of the connection part 270 and rotating the second pin member 232 in a reverse direction of the circumferential direction for connecting the second pin member 232. Accordingly, in the substrate support 110, the connection between the first pin member 231 and the second pin member 232 can be released.

In addition, the substrate support 110 according to the embodiment may have the following configuration to prevent the first pin member 231 from protruding and facilitate the lowering of the first pin member 231.

Figure 22A:
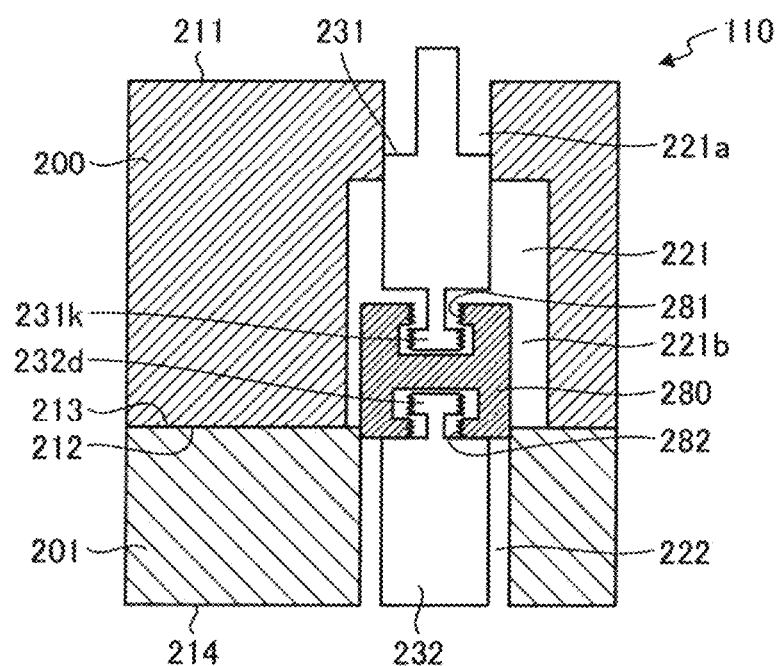
FIG. 22A schematically illustrates another example of the configuration of the substrate support according to the embodiment.

FIG. 22A schematically illustrates another example of the configuration of the substrate support 110 according to the embodiment. FIG. 22A shows a configuration for raising and lowering the first lifter pin 172. FIG. 22A illustrates a case in which the axes of the first through-hole 221 and the second through-hole 222 are aligned in a predetermined normal temperature state. Since the substrate support 110 shown in FIG. 22A has partially the same configuration as those of the substrate supports 110 shown in FIGS. 19A, 20, and 21A, redundant description thereof will be omitted by assigning like reference numerals to like parts, and differences will be mainly described.

The first pin member 231 has a first head portion 231$k$ at the lower end thereof. The first head portion 231$k$ is formed in a cylindrical shape, and a screw thread is formed on a circumferential surface thereof.

The second pin member 232 has a second head portion 232$d$ on the upper end thereof. The second head portion 232$d$ is formed in a cylindrical shape, and a screw thread is formed on a circumferential surface thereof.

The first pin member 231 and the second pin member 232 are connected by a connection part 280. The connection part 280 has a hollow structure having a space therein. The connection part 280 has a hole 281 formed in an end surface on the first pin member 231 side, and a hole 282 formed in an end surface on the second pin member 232 side. Screw grooves are formed on circumferential surfaces of the holes 281 and 282.

Figure 22B:
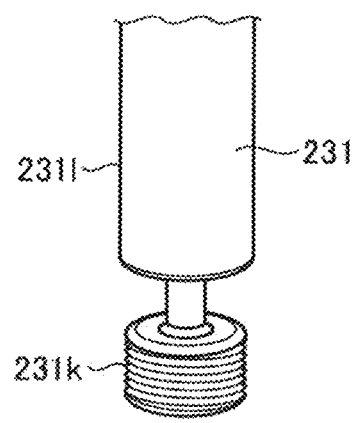
FIG. 22B schematically illustrates an example of the configuration of the first pin member according to the embodiment.

FIG. 22B schematically illustrates an example of the configuration of the first pin member 231 according to the embodiment. FIG. 22B shows a vicinity of the end portion of the first pin member 231 on the second surface 212 side. The first pin member 231 has the first head portion 231$k$ at the lower end thereof. The first head portion 231$k$ is formed in a cylindrical shape, and a screw thread is formed on the circumferential surface thereof. Further, the first pin member 231 has a thin first attaching portion 231$l$ provided with the first head portion 231$k$.

Figure 22C:
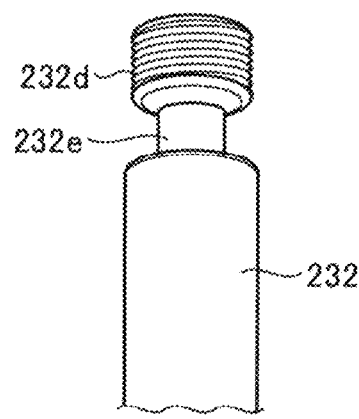
FIG. 22C schematically illustrates an example of the configuration of the second pin member according to the embodiment.

FIG. 22C schematically illustrates an example of the configuration of the second pin member 232 according to the embodiment. FIG. 22C shows a vicinity of the end portion of the second pin member 232 on the third surface 213 side. The second pin member 232 has a second head portion 232$d$ at the upper end thereof. The second head portion 232$d$ is formed in a cylindrical shape, and a screw thread is formed on a circumferential surface thereof. Further, the second pin member 232 has a thin second attaching portion 232$e$ provided with the second head portion 232$d$.

Figure 22D:
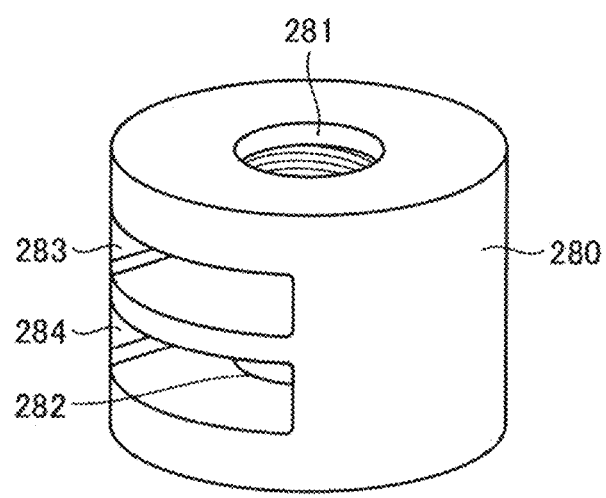
FIG. 22D illustrating an example of the configuration of the connection part according to the embodiment.

FIG. 22D illustrates an example of the configuration of the connection unit 280 according to the embodiment. The hole 281 is formed in the end surface of the connection part 280 on the first pin member 231 side. The hole 281 has a diameter that is substantially the same as that of the first head portion 231$k$, and a screw groove is formed on the circumferential surface thereof. Further, the hole 282 is formed in the end surface of the connection part 280 on the second pin member 232 side. The hole 282 has a diameter that is substantially the same as that of the second head portion 232$d$, and a screw groove is formed on the circumferential surface. The connection part 280 has a hollow structure having an upper space and a lower space therein. The connection part 280 has a hole 283 formed on an upper side surface and a hole 284 formed on a lower side surface. The upper space in the connection part 280 communicates with the hole 281 and the hole 283 formed on the side surface, and the upper space is wider than the size of the first head portion 231$k$. Further, the lower space in the connection part 280 communicates with the hole 282 and the hole 284 formed on the side surface, and the lower space is wider than the size of the second head portion 232$d$.

In the substrate support 110 shown in FIG. 22A, in the case of attaching the first pin member 231 and the second pin member 232, the end portion of the first pin member 231 opposite to the first head portion 231$k$ is inserted into the first through-hole 221 of the substrate support 110 from the second surface 212 side. Alternatively, the end portion of the first pin member 231 on the first head portion 231$k$ side may be inserted into the first through-hole 221 of the substrate support 110 from the first surface 211 side.

Then, the first head portion 231$k$ of the first pin member 231 is aligned with the hole 281 of the connection part 280, and the first pin member 231 is rotated in the circumferential direction until the first head portion 231$k$ reaches the space in the connection part 280. Accordingly, the first pin member 231 is connected to the connection part 280.

The end portion of the second pin member 232 opposite to the second head portion 232$d$ is inserted into the second through-hole 222 of the substrate support 110 from the third surface 213 side. Then, the end portion that has passed through the second through-hole 222 is attached to the driving unit 202. After the end portion of the second pin member 232 opposite to the second head portion 232$d$ is attached to the driving unit 202, the end portion of the second pin member 232 on the second head portion 232$d$ side may be inserted into the second through-hole 222 of the substrate support 110 from the fourth surface 214 side.

The second head portion 232$d$ of the second pin member 232 is aligned with the hole 282 of the connection portion 280, and the second pin member 232 is rotated in the circumferential direction until the second head portion 232$d$ reaches the space in the connection portion 280. Therefore, the first pin member 231 and the second pin member 232 are connected by the connection part 280. Accordingly, for example, even when the pressure in the processing container 102 is reduced and the first pin member 231 is pulled upward, the first pin member 231 cannot be raised because it is connected to the second pin member 232. In this manner, the substrate support 110 shown in FIG. 22A can prevent the first pin member 231 from protruding. In addition, the substrate support 110 can facilitate the lowering of the first pin member 231 by connecting the first pin member 231 and the second pin member 232. Further, in the substrate support 110, the first head portion 231$k$ can be separated from the hole 281 by aligning the first head portion 231$k$ with the hole 281 of the connection part 280 and rotating the first pin member 231 in a reverse direction of the circumferential direction for connecting the first pin member 231. Further, in the substrate support 110, the second head portion 232$d$ can be separated from the hole 282 by aligning the second head portion 232$d$ with the hole 282 of the connection portion 280 and rotating the second pin member 232 in a reverse direction of the circumferential direction for connecting the second pin member 232. Accordingly, in the substrate support 110, the connection between the first pin member 231 and the second pin member 232 can be released.

In the combination of the screw thread of the first head portion 231$k$ and the screw groove of the hole 281, and the combination of the screw thread of the second head portion 232$d$ and the screw groove of the hole 282, it is preferable that the screw threads and the screw grooves have opposite directions. For example, when the screw thread of the first head portion 231$k$ and the screw groove of the hole 281 are right hand threads, it is preferable that the screw thread of the second head portion 232$d$ and the screw groove of the hole 282 are left hand threads. Accordingly, it is possible to prevent the second head portion 232$d$ from being separated from the hole 282 in the case of rotating the first pin member 231 in a reverse direction of the circumferential direction for connecting the first pin member 231 in order to separate the first head portion 231k from the hole 281.

Further, the substrate support 110 according to the embodiment may have the following configuration to prevent the first pin member 231 from protruding and facilitate the lowering of the first pin member 231.

Figure 23A:
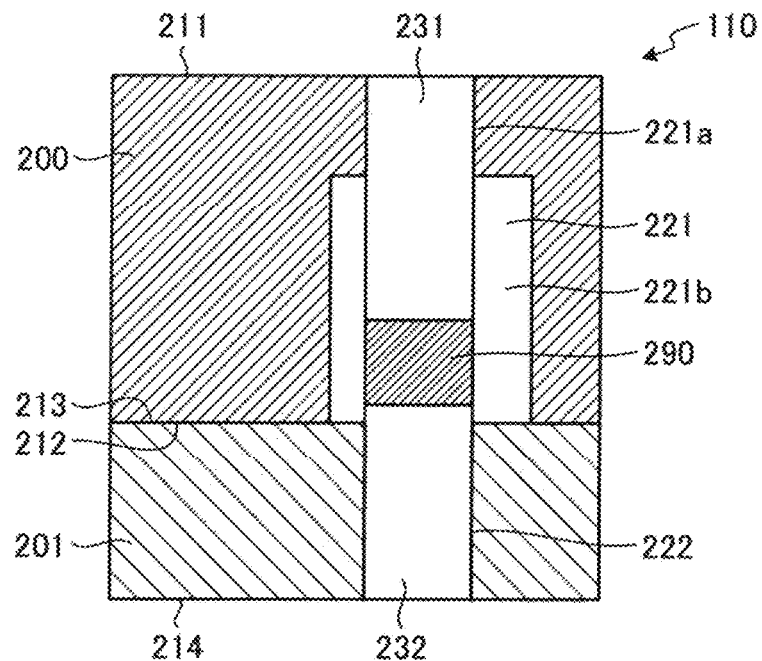
FIGS. 23A and 23B schematically illustrate another example of the configuration of the substrate support according to the embodiment.
Figure 23B:
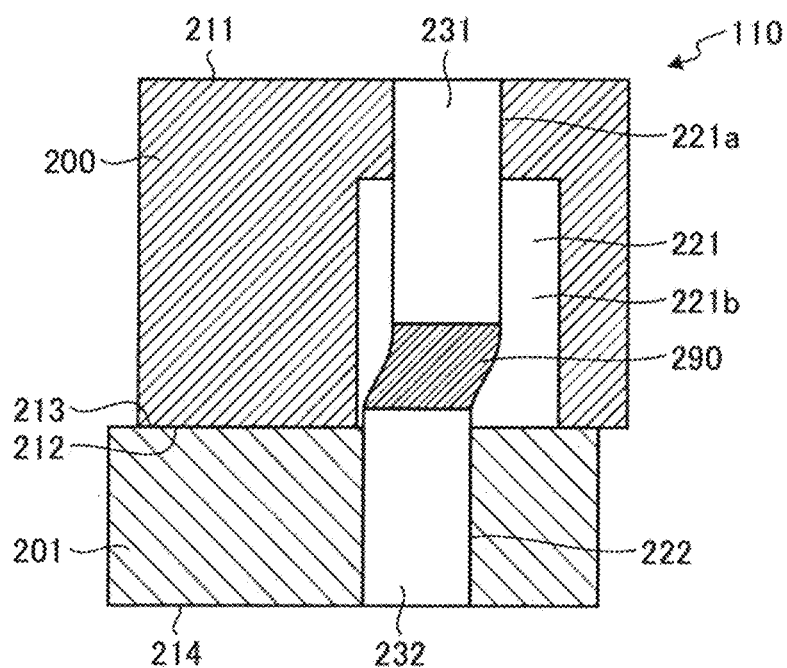

FIGS. 23A and 23B schematically illustrate another example of the configuration of the substrate support 110 according to the embodiment. FIG. 23A illustrates a configuration for raising and lowering the first lifter pin 172. FIG. 23A illustrates a case in which the axes of the first through-hole 221 and the second through-hole 222 are aligned in a predetermined normal temperature state. FIG. 23B shows a case where displacement occurs in the substrate support 110 according to the embodiment. Since the substrate support 110 shown in FIGS. 23A and 23B has partially the same configuration as that of the substrate support 110 shown in FIG. 19A, redundant description thereof will be omitted by assigning like reference numerals to like parts, and differences will be mainly described.

The first pin member 231 is stored in the first through-hole 221 and is movable in the axial direction of the first through-hole 221. The first pin member 231 is formed in a rod shape having a radius corresponding to the first section 221a on the upper side of the first through-holes 221.

The lower end of the first pin member 231 and the upper end of the second pin member 232 are connected by an elastic member 290. The elastic member 290 may have adhesiveness to adhere the lower end of the first pin member 231 and the upper end of the second pin member 232. Alternatively, an adhesive layer may be disposed on the elastic member 290 to adhere the lower end of the first pin member 231 and the upper end of the second pin member 232.

The elastic member 290 is elastically deformable. The elastic member 290 may be, e.g., a polyurethane (PU)-based resin. α GEL manufactured by Taica Corporation may be used as the elastic member 290.

In this manner, the substrate support 110 shown in FIG. 23A can prevent the first pin member 231 from protruding by connecting the first pin member 231 and the second pin member 232 using the elastic member 290. Further, the substrate support 110 can facilitate the lowering of the first pin member 231 by connecting the first pin member 231 and the second pin member 232. Further, in the substrate support 110, the first pin member 231 and the second pin member 232 can be connected to be movable even when positional displacement occurs between the first through-hole 221 and the second through-hole 222 as shown in FIG. 23B. Further, in the substrate support 110, since the first pin member 231 and the second pin member 232 are adhered by the elastic member 290, the first pin member 231 or the second pin member 232 can be separated by pulling them with a force greater than an adhesive force.

Effect

As described above, the substrate support 110 according to the embodiment includes the base 200, the support portion 201, the first pin member 231, the second pin member 232, and the driving unit 202. The base 200 has the first surface 211 (the first placement surface 115a and the second placement surface 116a) on which an object to be supported (the substrate W and the edge ring 119) is placed, and the second surface 212 opposite to the first surface 211. The base 200 has the first through-hole 221 penetrating through the first surface 211 and the second surface 212. The support portion 201 disposed to overlap the second surface 212 side of the base 200 has the third surface 213 that is in contact with the second surface 212, and the fourth surface 214 opposite to the third surface 213. The support portion 201 has the second through-hole 222 that penetrates through the third surface 213 and the fourth surface 214 to correspond to the position of the first through-hole 221 and communicates with the first through-hole 221. The first pin member 231 is stored in the first through-hole 221 and is movable in the axial direction of the first through-hole 221. The second pin member 232 is stored in the second through-hole 222 and is movable in the axial direction. The end portion of the second pin member 232 at the third surface 213 side is slidably in contact with the first pin member 231. The driving unit 202 drives the second pin member 232 in the axial direction. The first through-hole 221 is larger on the second surface 212 side than on the first surface 211 side, and/or the second through-hole 222 is larger on the third surface 213 side than on the fourth surface 214 side. Accordingly, in the substrate support 110, the gap between the through-hole and the pin can be reduced while allowing the pins (the first pin member 231 and the second pin member 232) to be movable even if the through-holes (the first through-hole 221 and the second through-hole 222) are displaced.

Further, the radius of the first through-hole 221 with respect to the displacement direction of the displacement caused by the difference in the thermal expansion between the base 200 and the support portion 201 is greater on the second surface 212 side than on the first surface 211 side by the displacement width or more, and/or the radius of the second through-hole 222 with respect to the displacement direction is greater on the third surface 213 side than on the fourth surface 214 side by the displacement width or more. Accordingly, in the substrate support 110, the damage to the first pin member 231 and the second pin member 232 can be suppressed even if the first through-hole 221 and the second through-hole 222 are displaced.

Further, the gap between the first through-hole 221 and the first pin member 231 on the first surface 211 side is set to a predetermined gap at which abnormal discharge is suppressed or a gap at which the first pin member 231 is slidable in the axial direction. The gap between the second through-hole 222 and the second pin member 232 on the fourth surface 214 side is set to a gap at which the second pin member 232 is slidable in the axial direction. Accordingly, in the substrate support 110, the occurrence of abnormal discharge can be suppressed.

Further, the second pin member 232 enters the first through-hole 221 by a movement of the second pin member 232 toward the third surface 213 side by the driving unit 202. The first pin member 231 is pressed by the second pin member 232 by the movement of the second pin member 232 toward the third surface 213 side, and protrudes from the first surface 211 to separate the object from the first surface 211. The first through-hole 221 is larger on the second surface 212 side than on the first surface 211 side at least in the region where the second pin member 232 enters from the second surface 212. Hence, in the substrate support 110, the damage to the second pin member 232 that has entered the first through-hole 221 can be suppressed while allowing the first pin member 231 and the second pin member 232 to be movable even if the first through-hole 221 and the second through-hole 222 are displaced.

Further, the first pin member 231 has entered the second through-hole 222, and is pressed by the second pin member 232 by the movement of the second pin member 232 toward the third surface 213 side by the driving unit 202. Then, the first pin member 231 protrudes from the first surface 211 and separates the object from the first surface 211. The second through-hole 222 is larger on the third surface 213 side than on the fourth surface 214 side at least in the region where the first pin member 231 enters from the third surface 213. Accordingly, in the substrate support 110, the damage to the first pin member 231 that has entered the second through-hole 222 can be suppressed while allowing the first pin member 231 and the second pin member 232 to be movable even if the first through-hole 221 and the second through-hole 222 are displaced.

Further, the sum of the radii of the first pin member 231 and the second pin member 232 with respect to the displacement direction of the displacement caused by the difference in the thermal expansion between the base 200 and the support portion 201 is greater than the displacement width. Accordingly, in the substrate support 110, the first pin member 231 can be moved via the second pin member 232 even if the first through-hole 221 and the second through-hole 222 are displaced.

Further, the placing base 110 according to the embodiment includes the base 200, the support portion 201, the first pin member 231, the second pin member 232, and the driving unit 202. The base 200 has the first surface 211 (the first placement surface 115a and the second placement surface 116a) on which an object to be supported (the substrate W and the edge ring 119) is placed, and the second surface 212 that is opposite to the first surface 211. The base 200 has the first through-hole 221 penetrating through the first surface 211 and the second surface 212. The support portion 201 disposed to overlap the second surface 212 side of the base 200 has the third surface 213 in contact with the second surface 212, and the fourth surface 214 opposite to the third surface 213. The support portion 201 has the second through-hole 222 that penetrates through the third surface 213 and the fourth surface 214 to correspond to the position of the first through-hole 221 and communicates with the first through-hole 221. The first pin member 231 is stored in the first through-hole 221 and is movable in the axial direction of the first through-hole 221. The second pin member 232 is stored in the second through-hole 222 and is movable in the axial direction. The end portion of the second pin member 232 on the third surface 213 side is slidably in contact with the first pin member 231. The driving unit 202 drives the second pin member 232 in the axial direction. Further, the radius of one of the first pin member 231 and the second pin member 232 with respect to the displacement direction of the displacement caused by the difference in the thermal expansion between the base 200 and the support portion 201 is greater than the radius of the other pin member by at least the displacement width. Accordingly, in the substrate support 110, the gap between the through-hole and the pin can be reduced while allowing the pins (the first pin member 231 and the second pin member 232) to be movable even if the through-holes (the first through-hole 221 and the second through-hole 222) are displaced.

The base 200 is provided with the temperature adjusting mechanism 117 capable of adjusting the temperature of the substrate support. Accordingly, in the substrate support 110, the base 200 can be adjusted to an appropriate temperature.

Further, the first pin member 231 has a material made of a high-density material, or is configured to be attracted toward the second pin member 232. Accordingly, in the substrate support 110, the first pin member 231 can be easily lowered.

While the embodiments of the present disclosure have been described, the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

For example, in the above embodiment, the case where the substrate processing is plasma etching has been described as an example. However, the substrate processing is not limited thereto, and may be any substrate processing as long as it is performed on an object placed on a substrate support.

Further, in the above embodiment, the case in which the substrate processing apparatus 100 is a capacitively coupled plasma (CCP) processing apparatus has been described. However, the present disclosure is not limited thereto. The substrate processing apparatus 100 may be any substrate processing apparatus. For example, the substrate processing apparatus 100 may by an inductively coupled plasma (ICP) processing apparatus, a capacitively coupled plasma (CCP) processing apparatus, an electron cyclotron resonance plasma (ECR) processing apparatus, a helicon wave plasma (HWP) processing apparatus, a surface wave plasma (SWP) processing apparatus, or the like.

Further, in the above embodiment, the case where the substrate W is a semiconductor wafer has been described as an example. However, the substrate W is not limited thereto, and may be any substrate.

Further, the embodiments of the present disclosure are illustrative in all respects and are not restrictive. The above-described embodiments can be embodied in various forms. Further, the above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A substrate support comprising:
   a base having a first surface on which an object to be supported is placed, a second surface opposite to the first surface, and a first through-hole penetrating through the first surface and the second surface;
   a support portion disposed to overlap the second surface side of the base, the support portion having a third surface in contact with the second surface, a fourth surface opposite to the third surface, and a second through-hole penetrating through the third surface and the fourth surface and communicating with the first through-hole;
   a first pin member that is stored in the first through-hole to be movable in an axial direction of the first through-hole;
   a second pin member that is stored in the second through-hole to be movable in the axial direction and has an end portion at the third surface side, the end portion being slidably in contact with the first pin member; and
   a driving unit configured to drive the second pin member in the axial direction, wherein the first through-hole is larger on the second surface side than on the first surface side, and/or the second through-hole is larger on the third surface side than on the fourth surface side, and wherein the first pin member has entered the second through-hole and is pressed by the second pin member by a movement of the second pin member toward the third surface side by the driving unit, and protrudes from the first surface to separates the object from the first surface, and the second through-hole is larger on the third surface side than on the fourth surface side at least in a region where the first pin member enters from the third surface.

2. The substrate support of claim 1, wherein a radius of the first through-hole with respect to a displacement direction of a displacement caused by a difference in thermal expansion between the base and the support portion is greater on the second surface side than on the first surface side by a displacement width or more, and/or a radius of the second through-hole with respect to the displacement direction is greater on the third surface side than on the fourth surface side by the displacement width or more.

3. The substrate support of claim 1, wherein a gap between the first through-hole and the first pin member on the first surface side is set to a predetermined gap at which abnormal discharge is suppressed or to a gap at which the first pin member is slidable in the axial direction, and a gap between the second through-hole and the second pin member on the fourth surface side is set to a gap at which the second pin member is slidable in the axial direction.

4. The substrate support of claim 1, wherein the second pin member enters the first through-hole by a movement of the second pin member toward the third surface side by the driving unit, and the first pin member is pressed by the second pin member by the movement of the second pin member toward the third surface side and protrudes from the first surface to separate the object from the first surface, and the first through-hole is larger on the second surface side than on the first surface side at least in a region where the second pin member enters from the second surface.

5. The substrate support of claim 1, wherein the base has a plurality of the first through-holes, the support portion has a plurality of second through-holes each of which is communicated with a corresponding one of the plurality of the through-holes and placed in a position corresponding to the corresponding one of the plurality of the through-holes, and the first pin member is stored in each of the plurality of the first through-holes, and the second pin member is stored in each of the plurality of the second through-holes.

6. The substrate support of claim 1, wherein the base is provided with a temperature adjusting mechanism configured to adjust a temperature of the substrate support.

7. The substrate support of claim 1, wherein the first pin member has a material made of a high-density material or is configured to be attracted toward the second pin member.

8. The substrate support of claim 1, wherein a ring having an outer diameter larger than a diameter of the first through-hole on the first surface side is attached to a vicinity of an end portion of the first pin member at the second surface side.

9. The substrate support of claim 1, wherein the first pin member and the second pin member are connected by a movable connection part.

10. The substrate support of claim 1, wherein the first pin member and the second pin member are connected by an elastic member.

11. A substrate support comprising:

a base having a first surface on which an object to be supported is placed, a second surface opposite to the first surface, and a first through-hole penetrating through the first surface and the second surface;

a support portion disposed to overlap the second surface side of the base, the support portion having a third surface in contact with the second surface, a fourth surface opposite to the third surface, and a second through-hole penetrating through the third surface and the fourth surface and communicating with the first through-hole;

a first pin member that is stored in the first through-hole to be movable in an axial direction of the first through-hole;

a second pin member that is stored in the second through-hole to be movable in the axial direction and has an end portion at the third surface side, the end portion being slidably in contact with the first pin member; and a driving unit configured to drive the second pin member in the axial direction, wherein a radius of one of the first pin member and the second pin member with respect to a displacement direction of a displacement caused by a difference in thermal expansion between the base and the support portion is greater than a radius of the other pin member by at least a displacement width.

12. The substrate support of claim 11, wherein the base has a plurality of the first through-holes, the support portion has a plurality of second through-holes each of which is communicated with a corresponding one of the plurality of the through-holes and placed in a position corresponding to the corresponding one of the plurality of the through-holes, and the first pin member is stored in each of the plurality of the first through-holes, and the second pin member is stored in each of the plurality of the second through-holes.

13. The substrate support of claim 11, wherein the base is provided with a temperature adjusting mechanism configured to adjust a temperature of the substrate support.

14. The substrate support of claim 11, wherein the first pin member has a material made of a high-density material or is configured to be attracted toward the second pin member.

15. The substrate support of claim 11, wherein a ring having an outer diameter larger than a diameter of the first through-hole on the first surface side is attached to a vicinity of an end portion of the first pin member at the second surface side.

16. The substrate support of claim 11, wherein the first pin member and the second pin member are connected by a movable connection part.

17. The substrate support of claim 11, wherein the first pin member and the second pin member are connected by an elastic member.

18. A substrate processing apparatus comprising:

the substrate support disclosed in claim 1, adapted to receive a substrate to be processed.

19. A substrate support comprising:

a base having a first surface on which an object to be supported is placed, a second surface opposite to the first surface, and a first through-hole penetrating through the first surface and the second surface;

a support portion disposed to overlap the second surface side of the base, the support portion having a third surface in contact with the second surface, a fourth surface opposite to the third surface, and a second through-hole penetrating through the third surface and the fourth surface and communicating with the first through-hole;

a first pin member that is stored in the first through-hole to be movable in an axial direction of the first through-hole;

a second pin member that is stored in the second through-hole to be movable in the axial direction and has an end portion at the third surface side, the end portion being slidably in contact with the first pin member; and a driving unit configured to drive the second pin member in the axial direction, wherein the first through-hole is larger on the second surface side than on the first surface side, and/or the second through-hole is larger on the third surface side than on the fourth surface side, and wherein a sum of radii of the first pin member and the second pin member with respect to a displacement direction of a displacement caused by a difference in thermal expansion between the base and the support portion is greater than a displacement width.

* * * * *